(12) United States Patent
Hwang et al.

(10) Patent No.: US 11,869,880 B2
(45) Date of Patent: Jan. 9, 2024

(54) METHOD OF TRANSFERRING MICRO-LIGHT EMITTING DIODE FOR LED DISPLAY

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Sungwoo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 17/090,077

(22) Filed: Nov. 5, 2020

(65) Prior Publication Data

US 2021/0134770 A1    May 6, 2021

Related U.S. Application Data

(60) Provisional application No. 62/930,880, filed on Nov. 5, 2019.

(30) Foreign Application Priority Data

Apr. 7, 2020 (KR) .................. 10-2020-0042411

(51) Int. Cl.
  *H01L 25/075* (2006.01)
  *H01L 23/00* (2006.01)
  *H01L 33/00* (2010.01)

(52) U.S. Cl.
  CPC .......... *H01L 25/0753* (2013.01); *H01L 24/08* (2013.01); *H01L 24/24* (2013.01); *H01L 24/80* (2013.01); *H01L 24/95* (2013.01); *H01L 33/0095* (2013.01); *H01L 24/82* (2013.01); *H01L 2224/08225* (2013.01); *H01L 2224/16225* (2013.01); *H01L 2224/245* (2013.01);

(Continued)

(58) Field of Classification Search
  CPC . H01L 2224/95101; H01L 2224/95102; H01L 24/82; H01L 2224/08225; H01L 2224/16225; H01L 2224/24137; H01L 2224/245; H01L 2224/8014; H01L 2224/80986; H01L 2224/9512; H01L 2224/95136; H01L 2924/10156; H01L 2924/12041; H01L 2933/004; H01L 33/0095; H01L 24/95; H01L 24/80; H01L 24/24; H01L 24/08; H01L 25/0753
  See application file for complete search history.

(56) References Cited

U.S. PATENT DOCUMENTS 9,876,000 B2    1/2018  Bibl et al.
10,439,101 B2 *  10/2019 Ahmed .................. H01L 33/38
(Continued)

FOREIGN PATENT DOCUMENTS

JP     2015-201649 A    11/2015
JP     2016-120601 A    7/2016
KR   10-2019-0085892 A   7/2019

*Primary Examiner* — Bilkis Jahan
*Assistant Examiner* — Victor V Barzykin
(74) *Attorney, Agent, or Firm* — Sughrue Mion, PLLC

(57) ABSTRACT

A method of transferring a micro light emitting diode (LED) to a pixel array panel includes transferring the micro LED by spraying using an inkjet method, wherein the micro LED includes an active layer including a first portion emitting light in a first direction and a second portion emitting the light in a second direction different from the first direction.

32 Claims, 33 Drawing Sheets

(52) U.S. Cl.
CPC ............... *H01L 2224/24137* (2013.01); *H01L 2224/8014* (2013.01); *H01L 2224/80986* (2013.01); *H01L 2224/9512* (2013.01); *H01L 2224/95102* (2013.01); *H01L 2224/95136* (2013.01); *H01L 2924/10156* (2013.01); *H01L 2924/12041* (2013.01); *H01L 2933/0041* (2013.01)

(56) References Cited

U.S. PATENT DOCUMENTS

| | | |
|---|---|---|
| 2004/0248416 A1* | 12/2004 | Bock ................... H01L 25/50 |
| | | 438/691 |
| 2014/0124802 A1 | 5/2014 | Do et al. |
| 2014/0145237 A1 | 5/2014 | Do et al. |
| 2014/0159064 A1 | 6/2014 | Sakariya et al. |
| 2014/0367705 A1 | 12/2014 | Bibi et al. |
| 2016/0148911 A1 | 5/2016 | Do |
| 2016/0172339 A1 | 6/2016 | Do |
| 2016/0211245 A1* | 7/2016 | Do ................. G02F 1/133603 |
| 2017/0138549 A1 | 5/2017 | Do et al. |
| 2017/0141279 A1 | 5/2017 | Do et al. |
| 2017/0200859 A1 | 7/2017 | Do et al. |
| 2017/0250168 A1 | 8/2017 | Do et al. |
| 2017/0317228 A1 | 11/2017 | Sung |
| 2018/0182741 A1 | 6/2018 | Sung et al. |
| 2019/0019930 A1 | 1/2019 | Do et al. |
| 2019/0035980 A1 | 1/2019 | Do et al. |
| 2019/0051724 A1 | 2/2019 | Do et al. |
| 2019/0088707 A1 | 3/2019 | Do et al. |
| 2019/0088724 A1 | 3/2019 | Do et al. |
| 2019/0113185 A1 | 4/2019 | Do et al. |
| 2019/0214438 A1 | 7/2019 | Do et al. |
| 2020/0013720 A1 | 1/2020 | Rogers et al. |

* cited by examiner

METHOD OF TRANSFERRING MICRO-LIGHT EMITTING DIODE FOR LED DISPLAY

CROSS-REFERENCE TO RELATED APPLICATIONS

This application is based on and claims the benefit of U.S. Provisional Patent Application No. 62/930,880, filed on Nov. 5, 2019, and is also based on and claims priority under 35 U.S.C. § 119 to Korean Patent Application No. 10-2020-0042411, filed on Apr. 7, 2020, in the Korean Intellectual Property Office, the disclosures of which are incorporated by reference herein in their entireties.

BACKGROUND

1. Field

The disclosure relates to display manufacturing, and more particularly, to methods of transferring a micro light emitting diode (LED) used as a pixel light source in a process of manufacturing an LED display.

2. Description of Related Art

In the past, liquid crystal displays (LCD) have been used for flat panel displays, however, as use of organic light emitting diodes (OLED) that do not use a liquid crystal has become widespread, supply of LCDs has decreased significantly. Recently, a light emitting diode (LED) display that directly uses a micro LED as a light source of each pixel has been introduced as a next-generation display. In the LED display, each pixel includes a micro LED (R micro LED) emitting red light, a micro LED (G micro LED) emitting green light, and a micro LED (B micro LED) emitting blue light to a sub-pixel region emitting red light R, a sub-pixel region emitting green light G, and a sub-pixel region emitting blue light B, respectively. Such a micro LED may be transferred to a pixel array panel through a transfer process.

SUMMARY

According to embodiments, there are provided methods of transferring micro LEDs in an LED display, whereby the micro LED transfer efficiency is increased.

According to embodiments, there are provided methods of quickly and accurately transferring micro LEDs in an LED display having a large-region pixel array panel.

Additional aspects will be set forth in part in the description which follows and, in part, will be apparent from the description, or may be learned by practice of embodiments of the disclosure.

In accordance with an aspect of the disclosure, a method of transferring at least one micro light emitting diode (LED) to a pixel array panel including a plurality of sub-pixel regions on which the at least one micro LED is to be mounted, includes transferring the at least one micro LED by spraying using an inkjet method, wherein the at least one micro LED includes an active layer including a first portion emitting first light in a first direction and a second portion emitting second light in a second direction different from the first direction.

The transferring of the at least one micro LED may include dividing the plurality of sub-pixel regions into a plurality of groups; and transferring a plurality of micro LEDs to each group from among the plurality of groups.

The transferring of the plurality of micro LEDs may include sequentially transferring the plurality of micro LEDs to each group from among the plurality of groups, wherein the sequentially transferring of the plurality of micro LEDs includes transferring a selected plurality of micro LEDs, from among the plurality of micro LEDs, to sub-pixel regions of a selected group from among the plurality of groups.

The simultaneously transferring of the selected plurality of micro LEDs may include transferring a micro LED emitting red light, green light, or blue light to each sub-pixel region from among the sub-pixel regions of the selected group.

The pixel array panel may be provided on a backplane of an LED display.

The sub-pixel regions of the selected group may include a plurality of red (R) sub-pixel regions, a plurality of green (G) sub-pixel regions and a plurality of blue (B) sub-pixel regions to form a plurality of pixels, wherein each pixel from among the plurality of pixels includes an R sub-pixel region from among the plurality of R sub-pixel regions, a G sub-pixel region from among the plurality of G sub-pixel regions, and a B sub-pixel region from among the plurality of B sub-pixel regions.

The simultaneously transferring of the selected plurality of micro LEDs to the sub-pixel regions of the selected group may include transferring a first micro LED to each R sub-pixel region from among the plurality of R sub-pixel regions using a first inkjet head; transferring a second micro LED to each G sub-pixel region from among the plurality of G sub-pixel regions using a second inkjet head; and transferring a third micro LED to each B sub-pixel region from among the plurality of B sub-pixel regions using a third inkjet head.

The plurality of micro LEDs may be transferred to each sub-pixel region from among the plurality of sub-pixel regions.

The method may further include removing a micro LED that is not correctly transferred from among the plurality of micro LEDs transferred to each sub-pixel region from among the plurality of sub-pixel regions; and transferring a same type of micro LED as a type of the correctly transferred micro LED to a position from which the micro LED is removed.

Banks may be provided between adjacent sub-pixel regions from among the plurality of sub-pixel regions.

Each of the sub-pixel regions may be divided into a plurality of regions, and the method may further include transferring one micro LED from among the plurality of micro LEDs to each region from among the plurality of regions.

Each region from among the plurality of regions may be defined by a mold for guiding the transferred one micro LED.

The at least one micro LED may include a first semiconductor layer, the active layer and a second semiconductor layer sequentially stacked to form a core-shell structure, and the at least one micro LED may include a vertical electrode micro LED or a horizontal electrode micro LED.

The method may further include transferring a respective micro LED emitting a same color light to all of the plurality of sub-pixel regions.

The micro LEDs emitting the same color light may emit a blue light.

The method may further include forming a first light conversion material layer on each respective micro LED transferred to an R sub-pixel region from among the plurality of sub-pixel regions; and forming a second light conversion material layer on each respective micro LED transferred to a G sub-pixel region from among the plurality of sub-pixel regions.

In accordance with an aspect of the disclosure, a method of transferring at least one micro LED to a pixel array panel including a plurality of pixel regions, includes transferring a first micro LED to a first pixel region from among the plurality of pixel regions; and transferring a second micro LED to a second pixel region from among the plurality of pixel regions, wherein the first micro LED and the second micro LED are transferred by spraying using an inkjet method, wherein each of the first micro LED and the second micro LED includes an active layer including a first portion emitting first light in a first direction and a second portion emitting second light in a second direction different from the first direction.

The transferring of the first micro LED to the first pixel region and the transferring of the second micro LED to the second pixel region may be performed simultaneously.

The transferring of the first micro LED to the first pixel region and the transferring of the second micro LED to the second pixel region may be performed sequentially.

A same type of micro LED may be transferred to the first pixel region and the second pixel region.

A third micro LED may be transferred to a remaining pixel region from among the plurality of pixel regions using the inkjet method.

Each of the first micro LED and the second micro LED may include a respective first semiconductor layer, the respective active layer and a respective second semiconductor layer sequentially stacked to form a respective core-shell structure, and each of the first micro LED and the second micro LED may include a vertical electrode micro LED or a horizontal electrode micro LED.

The transferring of the first micro LED to the first pixel region may include spraying a solution in which micro LEDs are mixed to the first pixel region using a first inkjet head.

The transferring of the first micro LED to the first pixel region may include transferring a plurality of first micro LEDs to the first pixel region; transferring a first group of first micro LEDs from among the plurality of first micro LEDs to a first sub-pixel region of the first pixel region using a first inkjet head; transferring a second group of first micro LEDs from among the plurality of first micro LEDs to a second sub-pixel region of the first pixel region using a second inkjet head; and transferring a third group of first micro LEDs from among the plurality of first micro LEDs to a third sub-pixel region of the first pixel region using a third inkjet head.

The transferring of the first group, the transferring of the second group, and the transferring of the third group may be sequentially or simultaneously performed.

The transferring of the first group, the transferring of the second group, and the transferring of the third group may be sequentially performed, wherein the method further includes, after the transferring of the plurality of first micro LEDs, removing a first micro LED from among the plurality of transferred first micro LEDs that is not correctly transferred; and transferring a same type of micro LED as a type of the correctly transferred first micro LED to a position from which the first micro LED is removed, and the removing and the transferring of the same type of micro LED are performed after the transferring of the plurality of second micro LEDs and the transferring of the plurality of third micro LEDs are performed.

The first sub-pixel region, the second sub-pixel region, and the third sub-pixel region may each be surrounded by a respective bank.

Each of the first sub-pixel region, the second sub-pixel region, and the third sub-pixel region comprises a respective plurality of regions, and the method may further include transferring one micro LED from among the plurality of first micro LEDs to each region from among the plurality of regions.

Each region from among the plurality of regions may be defined by a mold for guiding the transferred one micro LED.

The transferring of the micro LED to the second pixel region may include transferring a plurality of second micro LEDs to the second pixel region; transferring a first group of second micro LEDs from among the plurality of second micro LEDs to a first sub-pixel region of the second pixel region using a first inkjet head; transferring a second group of second micro LEDs from among the plurality of second micro LEDs to a second sub-pixel region of the second pixel region using a second inkjet head; and transferring a third group of second micro LEDs from among the plurality of second micro LEDs to a third sub-pixel region of the second pixel region using a third inkjet head.

The transferring of the first group, the transferring of the second group, and the transferring of the third group may be sequentially or simultaneously performed.

The transferring of the first group, the transferring of the second group, and the transferring of the third group may be sequentially performed, wherein the method further includes, after the transferring of the plurality of second micro LEDs, removing a second micro LED from among the plurality of transferred second micro LEDs that is not correctly transferred, and wherein the removing is performed after the transferring of the plurality of second micro LEDs and the transferring of the plurality of third micro LEDs are performed.

Each of the first sub-pixel region, the second sub-pixel region, and the third sub-pixel region may include a respective plurality of regions, and the method may further include transferring one micro LED from among the plurality of second micro LEDs to each region from among the plurality of regions.

Each region from among the plurality of regions may be defined by a mold for guiding the transferred one micro LED.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
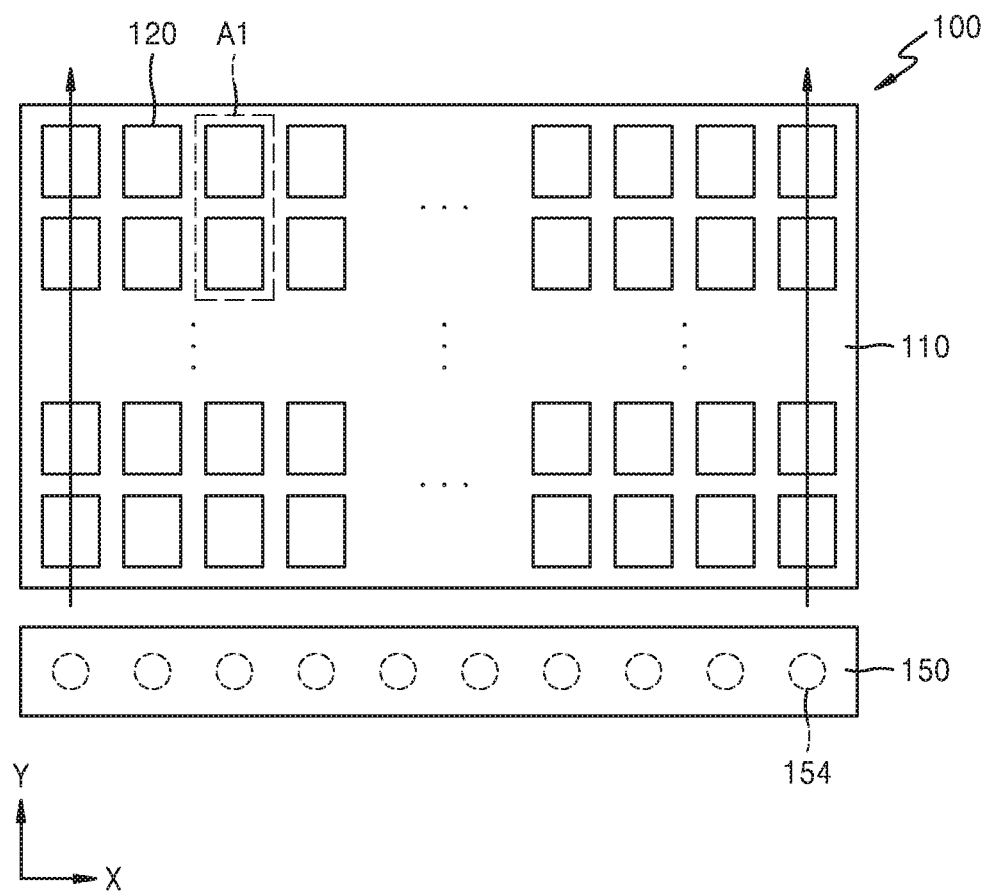
FIG. 1 is a plan view showing a process of transferring a micro light emitting diode (LED) to a pixel array panel using an inkjet head, in a micro LED transfer method for an LED display according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a micro LED transfer method for an LED display will be described in detail. The thickness of a layer or regions illustrated in the drawings may be exaggerated for convenience of explanation and clarity. Embodiments described below are merely examples, and various modifications may be possible from the embodiments. In a layer structure described below, an expression "above" or "on" may include not only "immediately on in a contact manner" but also "on in a non-contact manner".

FIG. 1 shows a process of transferring at least one micro light emitting diode (LED) to a pixel array panel 100 using an inkjet head 150 as a micro LED transfer method for an LED display according to an embodiment. The pixel array panel 100 includes a plurality of pixel regions 120, and each pixel region 120 may be a region to which the micro LED is to be transferred. The pixel array panel 100 may be provided on a backplane of the LED display. As a micro LED is transferred to each pixel region 120, each pixel region 120 may become a pixel. The micro LED transferred to each pixel region 120 may be used as a light source of each pixel. The plurality of pixel regions 120 may be divided into a plurality of groups. Each group may include some pixel regions of the plurality of pixel regions 120. When the total number of the plurality of pixel regions 120 is NP and the number of groups is NG, the number of pixel regions included in one group may be NP/NG. Therefore, the number of pixel regions 120 included in each group is smaller than the total number of pixel regions 120.

Meanwhile, regions having the same light emission characteristics may be grouped among a plurality of sub-pixel regions included in the plurality of pixel regions. For example, a plurality of sub-pixel regions (R sub-pixel regions) emitting red light included in the plurality of pixel regions may be grouped and referred to as an R sub-pixel region group. In this way, the plurality of pixel regions 120 may be divided into various groups. In other words, each group may include sub-pixel regions corresponding to the same color from different pixel regions.

The inkjet head 150 includes an injection hole 154 through which a micro LED is injected. The injection hole 154 may be an injection nozzle. The pixel array panel 100 may be a part or whole of a pixel array panel corresponding to the entire LED display. The inkjet head 150 may be a member that transfers the micro LED to each pixel region of the pixel array panel 100. For example, the inkjet head 150 may be designed to spray a solution in which micro LEDs are distributed instead of spraying ink in an inkjet head structure applied to an inkjet printer. In the pixel array panel 100, the plurality of pixel regions 120 may be aligned in horizontal and vertical directions or in X and Y directions as shown in FIG. 1 to form an array. The inkjet head 150 may transfer at least one micro LED to each pixel region 120 while traversing the pixel array panel 100 from one side of the pixel array panel 100 to the other. The transfer of the micro LED may be performed individually for each pixel region 120. The inkjet head 150 may be an inkjet head for transferring a micro LED emitting red light (R). The inkjet head 150 may be an inkjet head for transferring a micro LED emitting green light (G). The inkjet head 150 may be an inkjet head for transferring a micro LED emitting blue light (B). The inkjet head 150 may include a plurality of heads, for example, a plurality of inkjet heads for simultaneously transferring the same type of micro LEDs, or a plurality of inkjet heads for simultaneously or sequentially transferring different types (e.g., different colors) of micro LEDs.

In a process of transferring the micro LED, the inkjet head 150 may traverse the pixel array panel 100 in a given direction, for example, from the lower end of the pixel array panel 100 to the upper end (in the Y-axis direction). In an embodiment, the inkjet head 150 may move from left to right (in the X-axis direction) of the pixel array panel 100 or in the opposite direction and transfer the micro LED to the pixel array panel 100.

Figure 2:
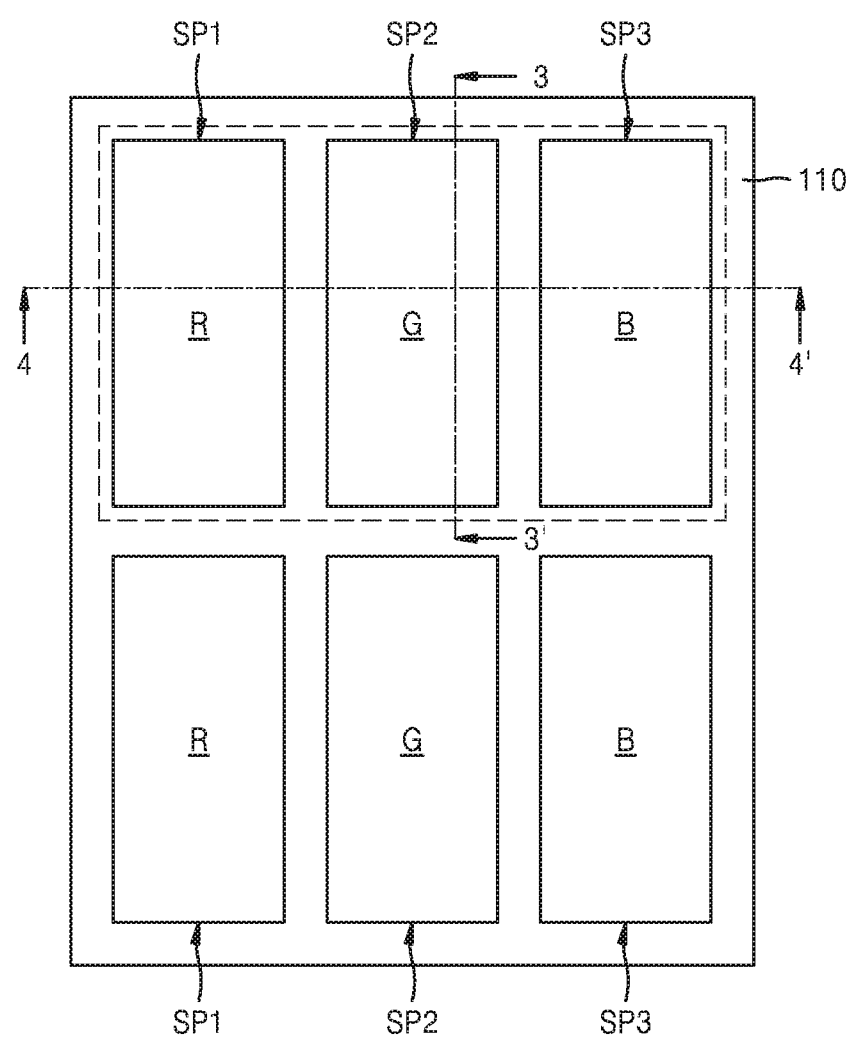
FIG. 2 is an enlarged plan view of a part including a selected region of FIG. 1, that is, two parallel pixel regions adjacent to each other in the Y-axis direction.

FIG. 2 is an enlarged plan view of a part including a selected region A1 of FIG. 1, that is, two pixel regions 120 adjacent and parallel to each other in the Y-axis direction.

Referring to FIG. 2, each pixel region 120 includes first to third sub-pixel regions SP1, SP2, and SP3. The first sub-pixel region SP1 may be a region in which a micro LED emitting red light is mounted. The second sub-pixel region SP2 may be a region in which a micro LED emitting green light is mounted. The third sub-pixel region SP3 may be a region in which a micro LED emitting blue light is mounted. The first to third sub-pixel regions SP1 to SP3 are spaced apart from each other. The spaces between the first to third sub-pixel regions SP1 to SP3 may be constant.

Figure 3:
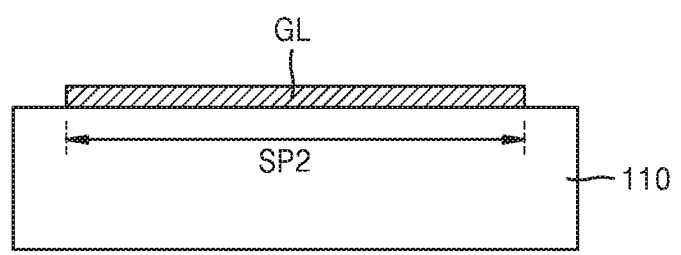
FIG. 3 is a cross-sectional view of FIG. 2 taken along a 3-3' direction.

FIG. 3 is a cross-sectional view of FIG. 2 taken along a 3-3' direction.

Referring to FIG. 3, a second wiring layer GL is formed on the second sub-pixel region SP2 of a substrate 110. The entire second sub-pixel region SP2 is covered with the second wiring layer GL. The second wiring layer GL may be wiring that supplies power to a micro LED mounted on the second sub-pixel region SP2. The micro LED may be mounted on the second wiring layer GL.

Figure 4:
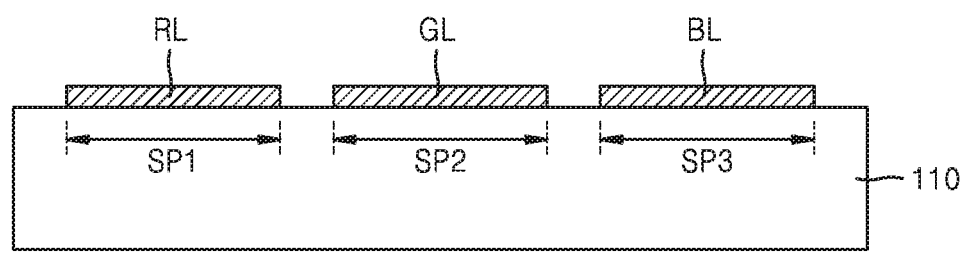
FIG. 4 is a cross-sectional view of FIG. 2 taken along a 4-4' direction.

FIG. 4 is a cross-sectional view of FIG. 2 taken along a 4-4' direction.

Referring to FIG. 4, a first wiring layer RL is present on the first sub-pixel region SP1 of the substrate 110. The second wiring layer GL is provided on the second sub-pixel region SP2. A third wiring layer BL is present on the third sub-pixel region SP3. The materials of the first to third wiring layers RL, GL, and BL may be the same, but may be different from each other. A micro LED emitting red light may be mounted on the first wiring layer RL. A micro LED emitting green light may be mounted on the second wiring layer GL. A micro LED emitting blue light may be mounted on the third wiring layer BL. The spaces between the first to third wiring layers RL, GL, and BL may be constant or different. The first to third wiring layers RL, GL, and BL may have the same thickness. One electrode of a micro LED may be connected to the power source through any of the first to third wiring layers RL, GL, and BL. The entire first sub-pixel region SP1 of the substrate 110 is covered with the first wiring layer RL. The entire second sub-pixel region SP2 of the substrate 110 may be covered with the second wiring layer GL. The entire third sub-pixel region SP3 of the substrate 110 may be covered with the third wiring layer BL.

Figure 5:
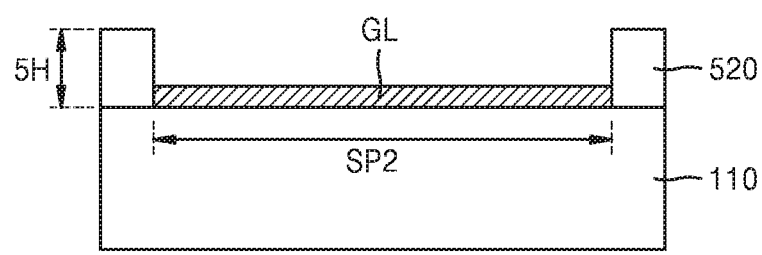
FIG. 5 shows an example of a cross-section of FIG. 2 taken along the 3-3' direction.

FIG. 5 shows an example of a cross-section of FIG. 1 taken along the 3-3' direction.

Referring to FIG. 5, a bank 520 defining the second sub-pixel region SP2 is formed on the substrate 110. The second sub-pixel region SP2 exists between the banks 520. Horizontally, the bank 520 and the second sub-pixel region SP2 are in contact with each other. The second wiring layer GL is on the second sub-pixel region SP2. The total thickness of the second wiring layer GL may be uniform. The second wiring layer GL and the bank 520 may be in contact with each other. The bank 520 may be higher than the second wiring layer GL. That is, the upper surface of the bank 520 may be higher than the upper surface of the second wiring layer GL. The bank 520 may serve as a fence for each of the sub-pixel regions SP1 to SP3. The bank 520 may be an insulating layer. A height 5H of the bank 520 may be greater than the sum of the thickness of a wiring layer RL, GL, or BL and the height of a micro LED to be transferred on the wiring layer RL, GL, or BL. That is, after the micro LED is transferred on each of the wiring layers RL, GL, and BL, the highest height of the transferred micro LED may be lower than the upper surface of the adjacent bank 520.

Figure 6:
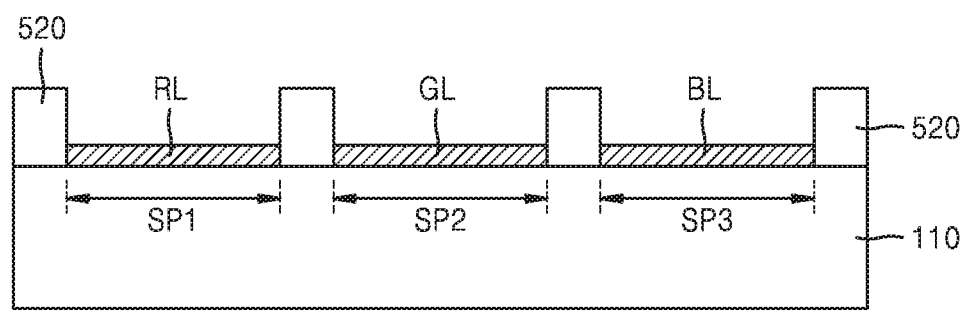
FIG. 6 shows an example of a cross-section of FIG. 2 taken along the 4-4' direction.

FIG. 6 shows an example of a cross-section of FIG. 2 taken along the 4-4' direction.

Referring to FIG. 6, the bank 520 defining the first to third sub-pixel regions SP1, SP2, and SP3 is formed on the substrate 110. The first to third sub-pixel regions SP1, SP2, and SP3 are positioned between the banks 520. The first wiring layer RL, the second wiring layer GL, and the third wiring layer BL respectively formed on the first to third sub-pixel regions SP1, SP2, and SP3 of the substrate 110 are present. Each wiring layer RL, GL, and BL is in contact with the adjacent bank 520. The upper surface of the substrate 110 between the sub-pixel regions SP1, SP2, and SP3 may be completely covered with the bank 520. In FIGS. 5 and 6, it may be seen that the perimeter of each sub-pixel region SP1, SP2, and SP3 of the substrate 110 is completely covered with the bank 520. Accordingly, the perimeter of the pixel region 120 of the substrate 110 is also covered with the bank 520.

Figure 7:
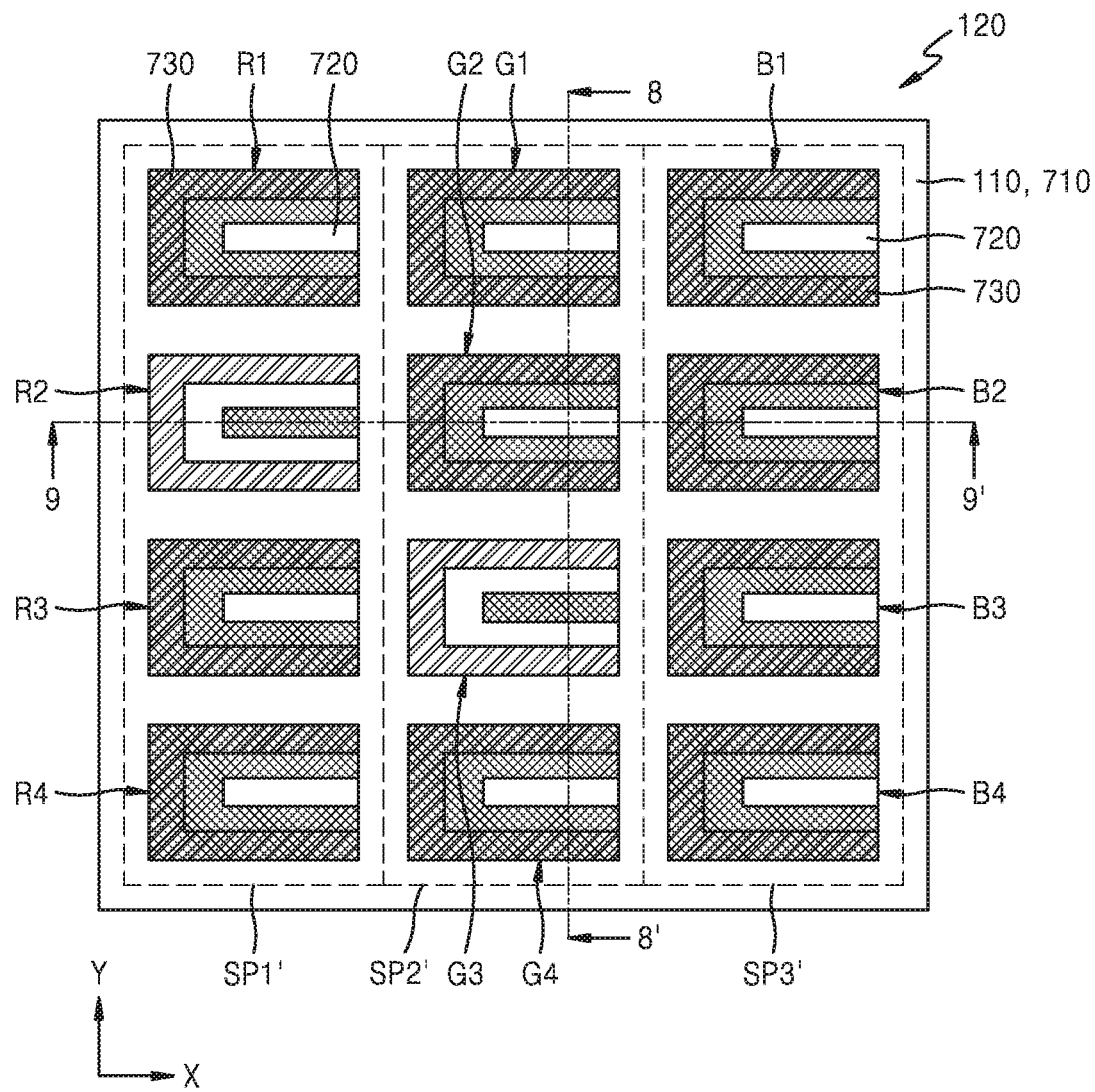
FIG. 7 is a plan view showing an embodiment of the selected region of FIG. 1.

The micro LED having a vertical electrode may be mounted on each of the sub-pixel regions SP1, SP2, and SP3 illustrated in FIGS. 2 to 6. FIG. 7 shows an embodiment of a portion of the selected region A1 of FIG. 1.

FIG. 7 shows only one pixel region 120 of the two pixels included in the selected region A1 for convenience.

Referring to FIG. 7, the pixel region 120 includes first to third sub-pixel regions SP1', SP2', and SP3'. The first sub-pixel region SP1' may be a sub-pixel region in which a micro LED emitting red light is mounted. The second sub-pixel region SP2' may be a sub-pixel region in which a micro LED emitting green light is mounted. The third sub-pixel region SP3' may be a sub-pixel region in which a micro LED emitting blue light is mounted. The first sub-pixel region SP1' may include first to fourth regions R1, R2, R3, and R4. The first to fourth regions R1, R2, R3, and R4 are spaced apart from each other, and the spaces may be constant. A mold 710 may exist between the first to fourth regions R1, R2, R3, and R4. That is, the first to fourth regions R1, R2, R3, and R4 may be regions defined by the mold 710. The second sub-pixel region SP2' may include first to fourth regions G1, G2, G3, and G4. The first to fourth regions G1, G2, G3, and G4 are spaced apart from each other, and are aligned in parallel with the first to fourth regions R1, R2, R3, and R4 of the first sub-pixel region SP1'. The first to fourth regions G1, G2, G3, and G4 of the second sub-pixel region SP2' are spaced apart from each other, and the mold 710 exists therebetween. The third sub-pixel region SP3' includes first to fourth regions B1, B2, B3, and B4. The first to fourth regions B1, B2, B3, and B4 are aligned in parallel with the first to fourth regions G1, G2, G3, and G4 of the second sub-pixel region SP2'. The first to fourth regions B1, B2, B3, and B4 of the third sub-pixel region SP3' are spaced apart from each other, and the mold 710 exists therebetween. The mold 710 may surround the entire first to third sub-pixel regions SP1', SP2', and SP3'. In other words, each sub-pixel region SP1', SP2', and SP3' may be also surrounded by the mold 710. Each of regions R1-R4, G1-G4, and B1-B4 of the first to third sub-pixel regions SP1', SP2', and SP3' may include the same electrode wiring layer. For example, as an example of the first sub-pixel region SP1', the first region R1 of the first sub-pixel region SP1' may include a first wiring layer 720 and a second wiring layer 730. The first wiring layer 720 and the second wiring layer 730 are spaced apart from each other. The first wiring layer 720 is formed in a direction parallel to the X axis. The second wiring layer 730 includes a component parallel to the X axis and a component parallel to the Y axis. The second wiring layer 730 may be disposed in a form surrounding the first wiring layer 720 as shown in FIG. 7. A part of the second wiring layer 730 parallel to the X axis is disposed both above and below the first wiring layer 720. A part of the second wiring layer 730 parallel to the Y axis is located on the left side of the first wiring layer 720. The first wiring layer 720 may be bonded to any one of a P-type electrode and an N-type electrode of a micro LED to be mounted on the first region R1. The second wiring layer 730 may be bonded to the other one of the two electrodes of the micro LED. For example, the first wiring layer 720 may be bonded to the P-type electrode of the micro LED mounted on the first region R1, and the second wiring layer 730 may be bonded to the N-type electrode of the micro LED. The mold 710 defining each of the sub-pixel regions SP1', SP2', and SP3' in the pixel region 120 may be an insulating material layer. The mold 710 may be configured to serve to guide the micro LED to each region of each sub-pixel region SP1', SP2', and SP3'. Each of the first to third sub-pixel regions SP1', SP2', and SP3' includes four regions, but is not limited to four regions, and may include more or fewer than four regions.

Figure 8:
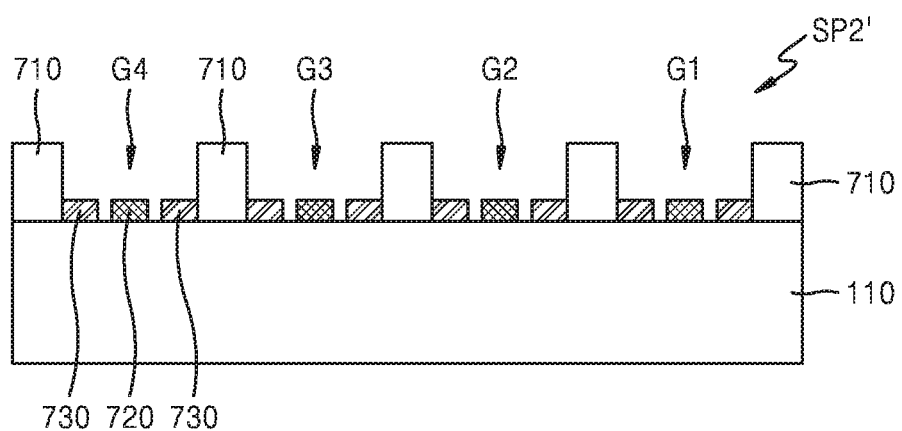
FIG. 8 is a cross-sectional view of FIG. 7 taken along an 8-8' direction.

FIG. 8 is a cross-sectional view of FIG. 7 taken along an 8-8' direction.

Referring to FIG. 8, the molds 710 are disposed on the substrate 110 at a given interval. The mold 710 may define the first to fourth regions G1 to G4 of the second sub-pixel region SP2'. The first wiring layer 720 and the second wiring layer 730 are formed on each region of the substrate 110 corresponding to the first to fourth regions G1 to G4. The height of the upper surface of the mold 710 may be higher than the upper surfaces of the first and second wiring layers 720 and 730. As will be described later, the cross-sectional shape of the mold 710 may be other shapes. For convenience, the cross section of the mold 710 is shown as a rectangle. In each region G1, G2, G3, and G4, the first wiring layer 720 is positioned between portions of the second wiring layer 730.

Figure 9:
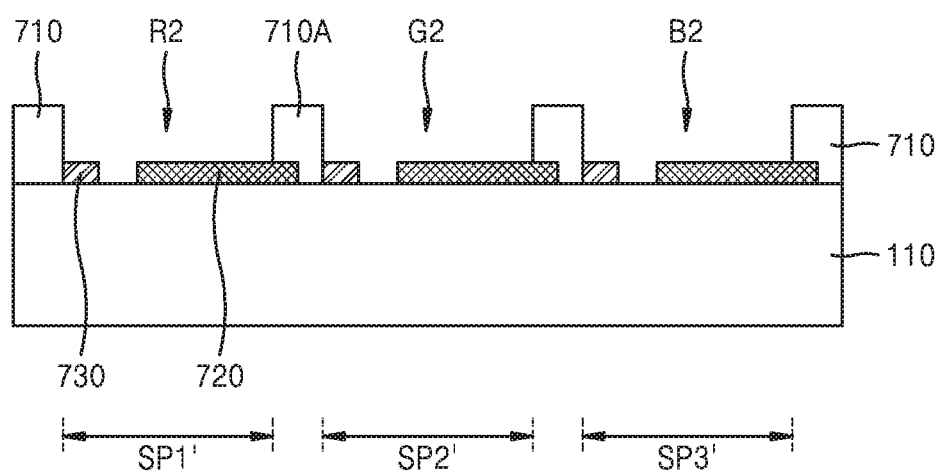
FIG. 9 is a cross-sectional view of FIG. 7 taken along a 9-9' direction.

FIG. 9 is a cross-sectional view of FIG. 7 taken along a 9-9' direction.

Referring to FIG. 9, the mold 710 is disposed on the substrate 110. The mold 710 defines the second region R2 of the first sub-pixel region SP1', the second region G2 of the second sub-pixel region SP2', and the second region B2 of the third sub-pixel region SP3' on the substrate 110. The first wiring layer 720 and the second wiring layer 730 are formed on the substrate 110 in each of the second regions R2, G2, and B2. The first wiring layer 720 is in contact with the mold 710 on the right. The second wiring layer 730 is in contact with the mold 710 on the left. A part of the right side of the first wiring layer 720 may be covered with the mold 710.

Figure 10:
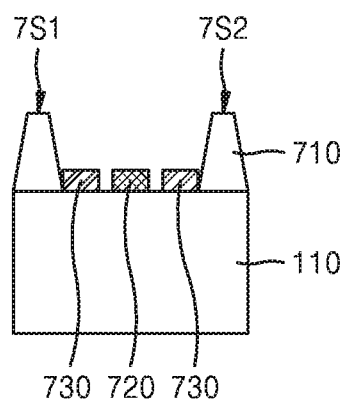
FIG. 10 is a cross-sectional view showing another form of a mold of FIGS. 8 and 9.

Meanwhile, the shape of the mold 710 in FIGS. 8 and 9 may be different. For example, as illustrated in FIG. 10, the mold 710 may have a shape in which the lower end is wider than the upper end. That is, the width of the mold 710 may decrease from the bottom to the top. Accordingly, both side surfaces 7S1 and 7S2 of the mold 710 are inclined surfaces. The inclined surface may become a surface that guides a micro LED to each sub-pixel region. When the micro LED is transferred while the cross-section of the micro LED transferred to each sub-pixel region maintains the same shape as the cross-section of each sub-pixel region (for example, an inverted rhombus tapered toward the bottom), the transferred micro LED may be correctly mounted on the corresponding sub-pixel region. Conversely, when the micro LED transferred to each sub-pixel region is transferred in an inverted state, the transferred micro LED has the cross-section of a non-inverted rhombus shape and is difficult to be mounted on the corresponding sub-pixel region.

As a result, the mold 710 having the inclined side surfaces 7S1 and 7S2 may be a self-alignment member or self-aligning means of the micro LED transferred to each sub-pixel region. Therefore, the transfer efficiency of the micro LED may increase. That is, as micro LEDs are transferred by using an inkjet injection method, the number of micro LEDs accurately and correctly transferred to the sub-pixel regions may increase.

Figure 11:
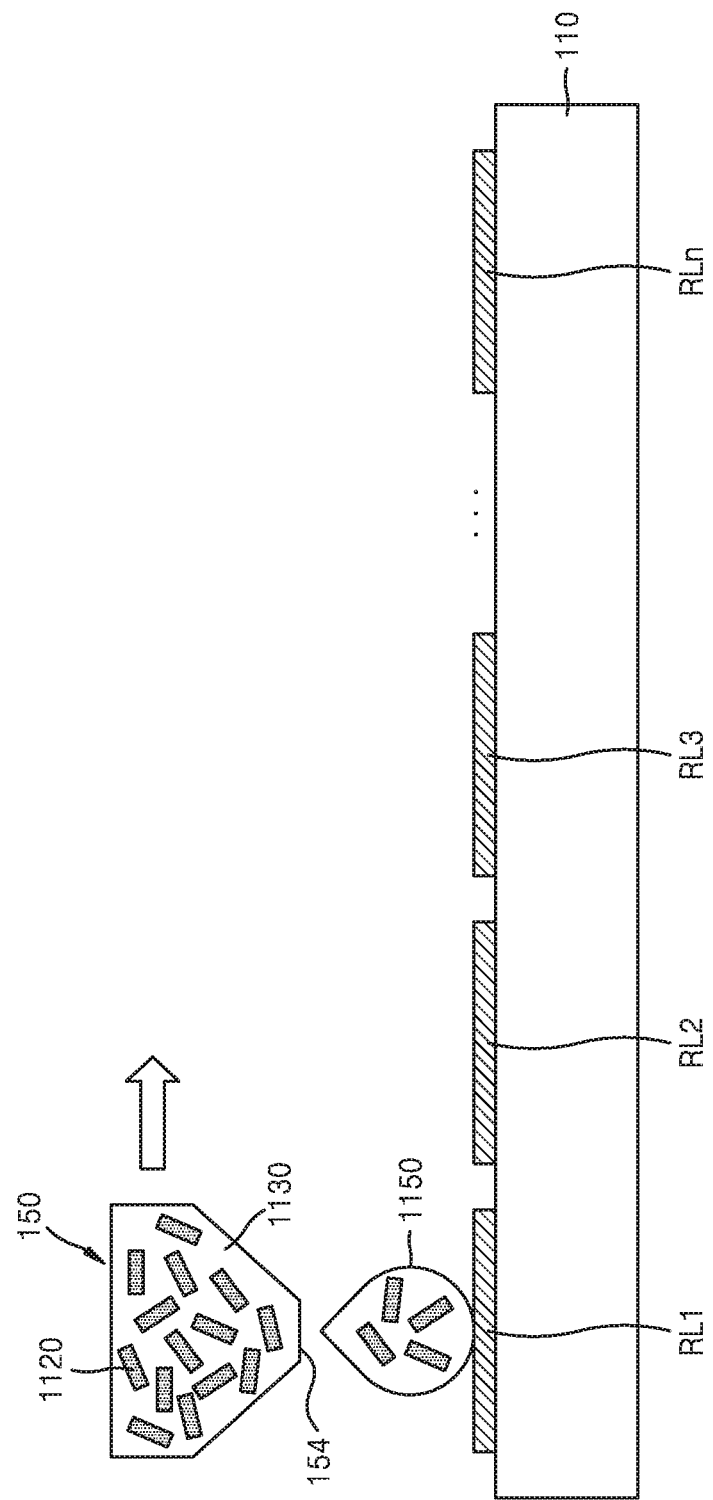
FIGS. 11 to 13 are cross-sectional views illustrating an example of a method of transferring micro LEDs to pixel regions shown in FIGS. 2 to 4 using an inkjet head.

FIG. 11 shows an example of a method of transferring micro LEDs 1120 to pixel regions shown in FIGS. 2 to 4 using an inkjet head.

FIG. 11 shows a process of transferring the micro LEDs 1120 to the same sub-pixel region (i.e., the same group) of a plurality of pixel regions. Here, the same sub-pixel region may be, for example, a region on which a micro LED emitting red light is mounted.

Referring to FIG. 11, the inkjet head 150 first drops (sprays) a micro LED droplet 1150 on the first wiring layer RL1 of a first sub-pixel region of a first pixel region. The micro LED droplet 1150 may include the plurality of micro LEDs 1120 and a volatile solution 1130. The micro LED droplets 1150 may include one or more micro LEDs 1120, for example, one to six micro LEDs 1120. The micro LED droplet 1150 is ejected through an injection hole 154 of the inkjet head 150. The inkjet head 150 may accommodate a micro LED solution. The micro LED solution refers to the solution 1130 in which the plurality of micro LEDs 1120 are uniformly mixed (distributed). In an example, the solution 1130 may be water, a solvent, or a volatile organic material.

The inkjet head 150 may contain an amount of a micro LED solution capable of transferring the micro LEDs 1120 to the plurality of pixel regions.

Figure 12:
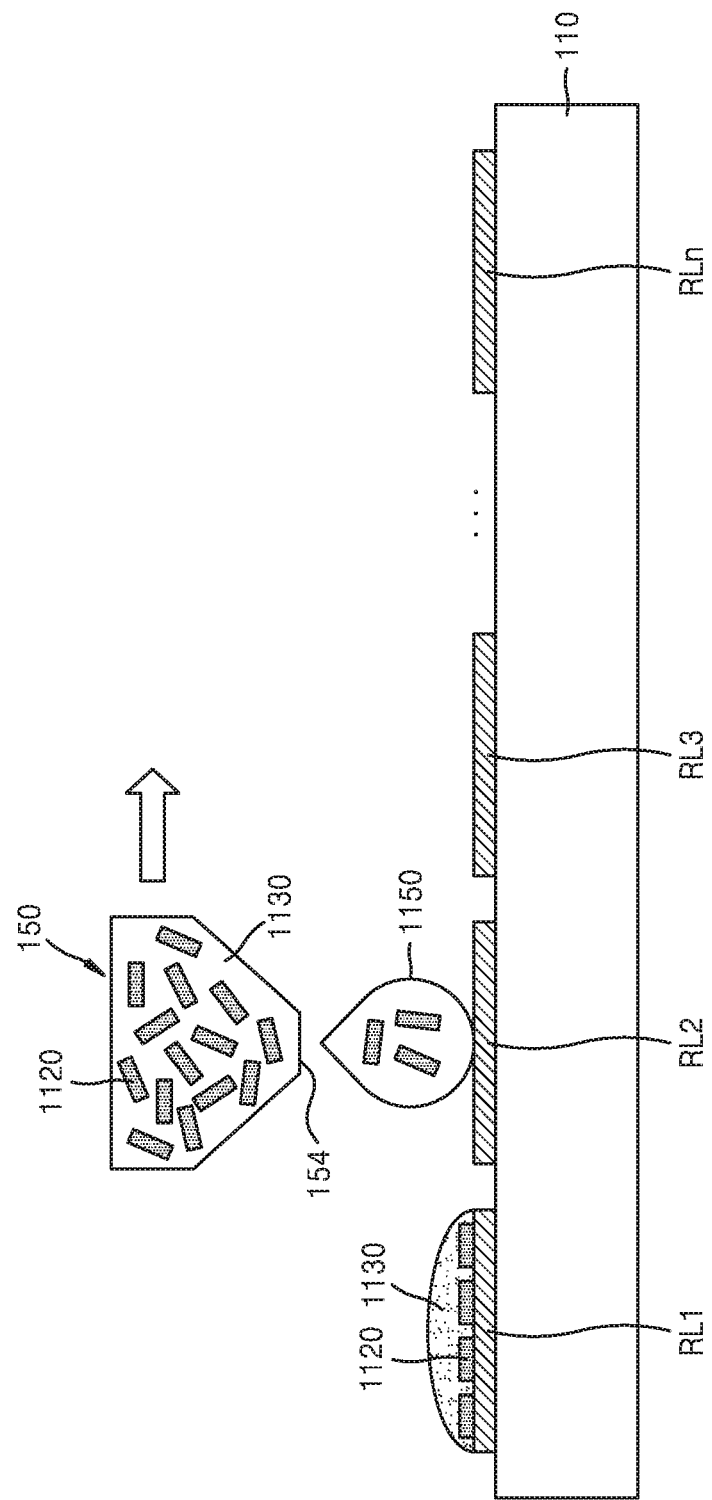
Figure 16:
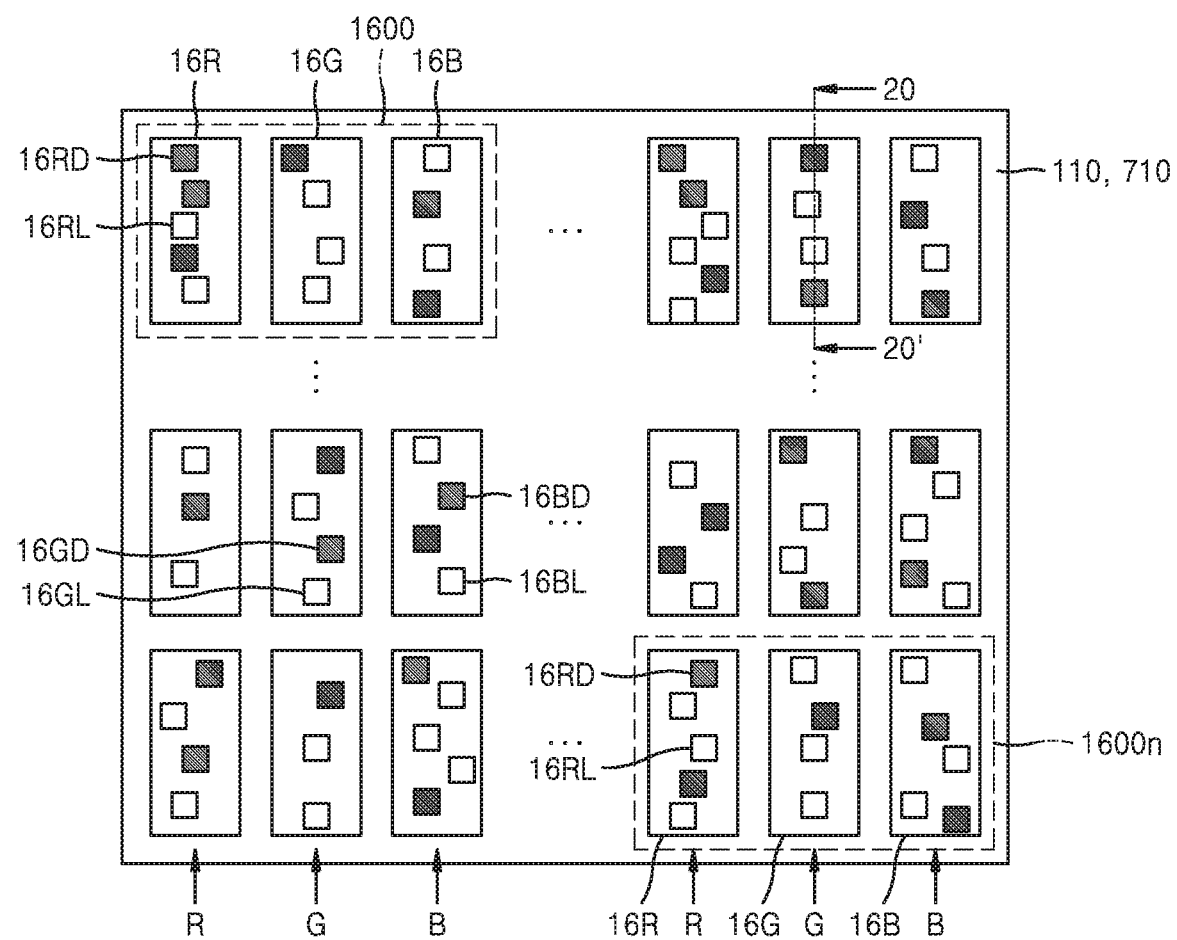
FIG. 16 is a plan view showing micro LED transfer results according to micro LED transfer methods shown in FIGS. 11 to 15.

When the micro LED droplets 1150 are sprayed (dropped) on the first wiring layer RL1 of the first sub-pixel region of the first pixel region, as shown in FIG. 12, the plurality of micro LEDs 1120 may be aligned (mounted) on the first wiring layer RL1. The solution 1130 covering the aligned micro LEDs 1120 is volatilized soon, and only the plurality of micro LEDs 1120 remain on the first wiring layer RL1. In FIG. 12, for convenience, the micro LEDs 1120 are aligned on the first wiring layer RL1 at regular spaces, but as illustrated in FIG. 16, the spaces between the transferred plurality of micro LEDs 1120 may not be constant. Also, some of the micro LEDs 1120 may be mounted upside down.

After the micro LEDs 1120 are transferred onto the first wiring layer RL1 of the first sub-pixel region of the first pixel region, as shown in FIG. 12, the inkjet head 150 is moved over the first wiring layer RL2 of a first sub-pixel region of a second pixel region and then one drop of the micro LED droplets 1150 is sprayed (dropped) on the first wiring layer RL2.

Figure 13:
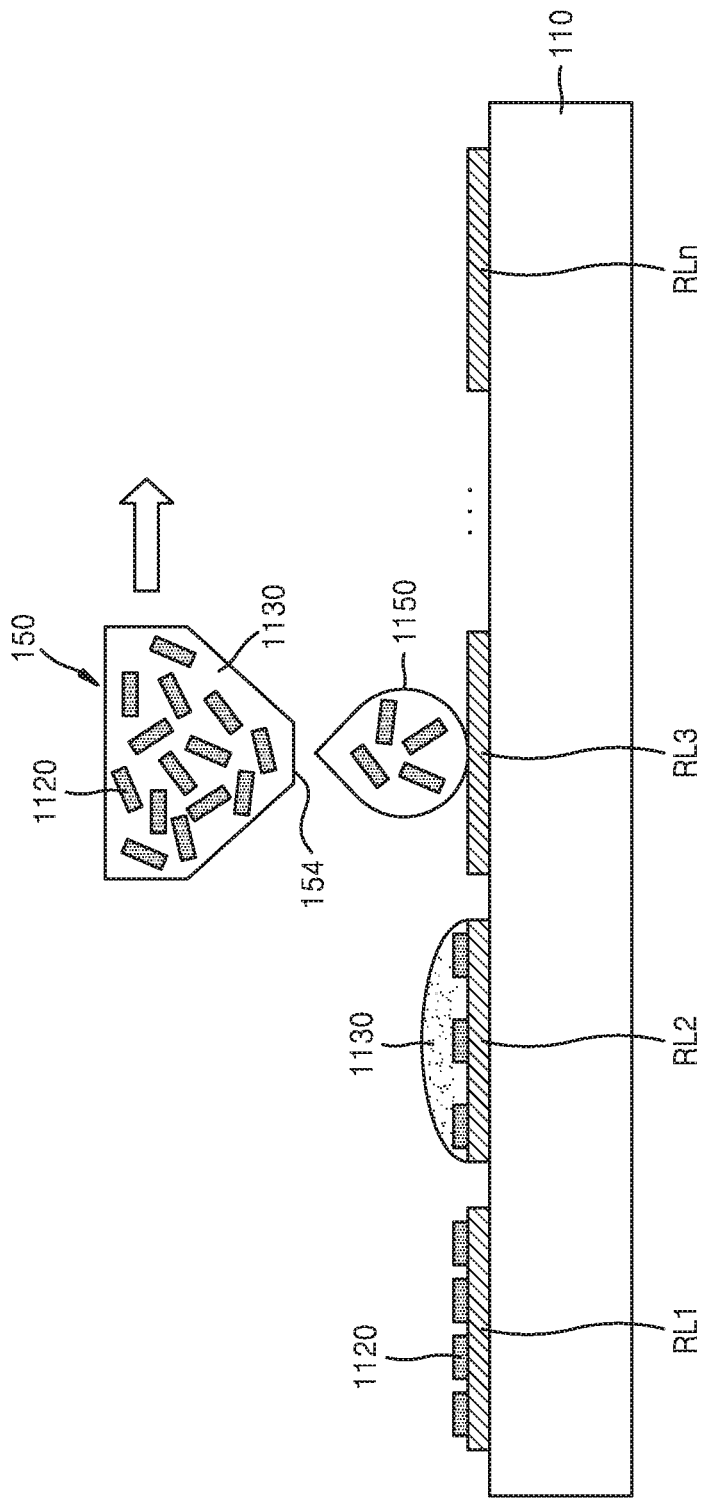

Next, as shown in FIG. 13, one drop of the micro LED droplets 1150 is sprayed onto a first wiring layer RL3 of a first sub-pixel region of a third pixel region. This spray process is repeated until an nth pixel region. The nth pixel region may be the last pixel in the Y-axis direction in FIG. 1. After the micro LED droplets 1150 are sprayed on a first wiring layer RLn of a first sub-pixel region of the n-th pixel region to mount the micro LED on the first wiring layer RLn, a second micro LED is mounted on a second wiring layer of each second sub-pixel region of the first to n-th pixel regions by using a second inkjet head. The second inkjet head may be structurally the same as the inkjet head 150 except for only a type of the micro LED accommodated in a head. The wavelength of light emitted from the second micro LED may be different from the wavelength of light emitted from the micro LED 1120 (hereinafter, a first micro LED). For example, red light R may be emitted from the first micro LED 1120 and green light G may be emitted from the second micro LED. The micro LED transfer process using the second inkjet head may be the same as the micro LED transfer process using the inkjet head 150 (hereinafter, a first inkjet head).

After the micro LED transfer process is performed using the second inkjet head, a third micro LED may be mounted on a third wiring layer of each third sub-pixel region of the first to nth pixel regions using a third inkjet head. The third inkjet head may differ only in the type of micro LED to be transferred, and may be structurally the same as the first inkjet head 150 and the second inkjet head. The light emission characteristics of the third micro LED may be different from those of the first micro LED 1120 and the second micro LED. For example, the third micro LED may be a micro LED emitting blue light (B).

In the process of transferring the first micro LED 1120 and the second and third micro LEDs, the first inkjet head 150 and the second and third inkjet heads may be sequentially or simultaneously moved. For example, the first micro LED 1120 may be transferred onto the wiring layers RL1, RL2, RL3, RLn of the first sub-pixel regions of the first to nth pixel regions using the first inkjet head 150 and then, the second micro LED may be transferred onto the wiring layers of the second sub-pixel regions of the first to nth pixel regions using the second inkjet head, and continuously the third micro LED may be transferred onto the wiring layers of the third sub-pixel regions of the first to nth pixel regions using the third inkjet head. Alternatively, the first micro LED 1120, the second micro LED, and the third micro LED are all simultaneously sprayed on the wiring layers RL1, RL2, RL3, RLn of the first sub-pixel regions of the first to nth pixel regions, the wiring layers of the second sub-pixel regions of the first to nth pixel regions and the wiring layers of the third sub-pixel regions of the first to nth pixel regions, respectively, by using the first inkjet head 150 and the second and third inkjet heads together and thus, the micro LED emitting red light, the micro LED emitting green light, and the micro LED emitting blue light may be simultaneously transferred on the sub-pixel regions of each pixel region respectively. The first inkjet head 150 may be moved from the left to the right of the pixel array panel 100 of FIG. 1, i.e., in the X-axis direction. This movement may also be applied to the second and third inkjet heads.

Figure 14:
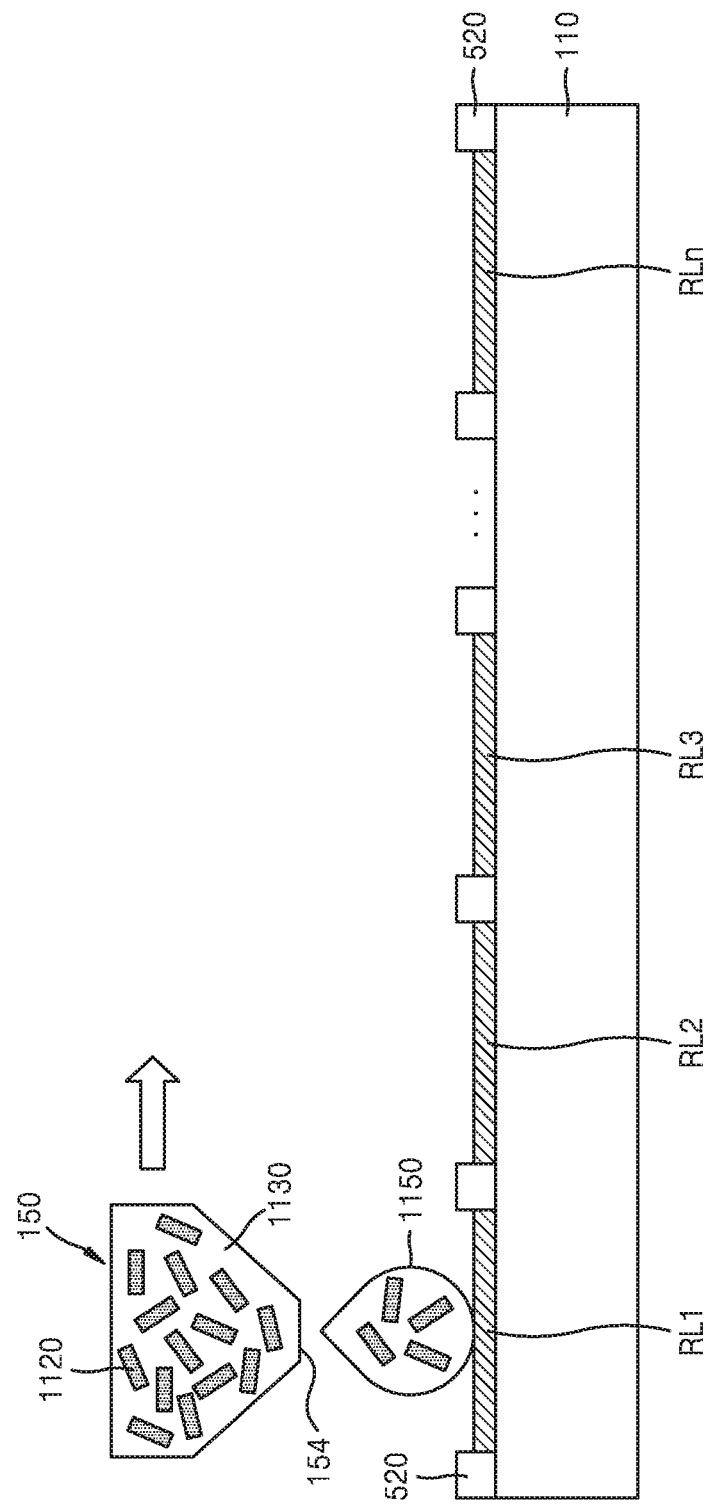
FIGS. 14 and 15 show a process of transferring a micro LED to a pixel region defined by a bank shown in FIGS. 2, 5 and 6 using an inkjet head.
Figure 15:
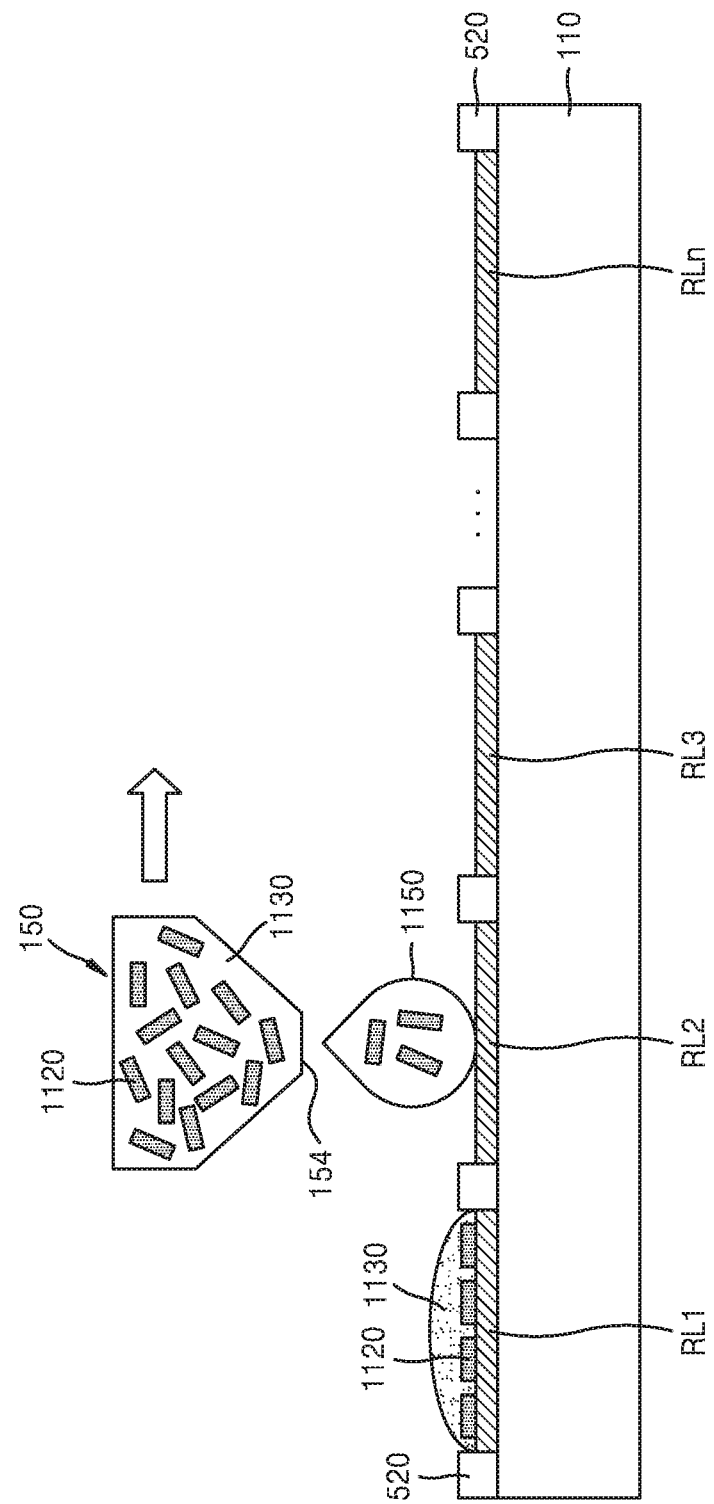

FIGS. 14 and 15 show a process of transferring a micro LED to a pixel region defined by the bank 520 described with reference to FIGS. 2, 5 and 6 using an inkjet head.

A micro LED transfer method illustrated in FIGS. 14 and 15 may be performed in the same manner as the micro LED transfer method described with reference to FIGS. 11 to 13. In FIGS. 14 and 15, the first inkjet head 150 may be an inkjet head for transferring a micro LED emitting red light, an inkjet head for transferring a micro LED emitting green light, or an inkjet head for transferring a micro LED emitting blue light. Therefore, depending on the use of the first inkjet head 150, the micro LED 1120 injected from the first inkjet head 150 may be the micro LED emitting red light, the micro LED emitting green light, or the micro LED emitting blue light.

FIG. 16 shows micro LED transfer results according to micro LED transfer methods shown in FIGS. 11 to 15.

Referring to FIG. 16, a plurality of micro LEDs 16RL, 16RD, 16GL, 16GD, 16BL, and 16BD are present in each of first to third sub-pixels 16R, 16G, and 16B of a pixel 1600. The number of micro LEDs present in each sub-pixel 16R, 16G, and 16B of each pixel 1600 may be the same or different. For example, four micro LEDs 16RL and 16RD may be present in the first sub-pixel 16R of the pixel 1600, and five micro LEDs 16RL and 16RD may be present in the first sub-pixel 16R of another pixel 1600n. As such, the number of micro LEDs mounted on corresponding sub-pixels between pixels may be the same or different from each other. Even in the same pixel 1600, the total number of micro LEDs mounted on each sub-pixel 16R, 16G, and 16B may be the same or different from each other. For example, as illustrated in FIG. 16, five micro LEDs may be mounted on the first sub-pixel 16R of the pixel 1600, and four micro LEDs may be mounted on the second and third sub-pixels 16G and 16B. Further, even when the same number of micro LEDs is mounted on each sub-pixel 16R, 16G, 16B of the same pixel 1600, the number of normally mounted micro LEDs may be the same or different for each sub-pixel 16R, 16G, and 16B. For example, among the micro LEDs 16RL and 16RD mounted on the first sub-pixel 16R, the number of normally mounted micro LEDs 16RL may be 2, and among the micro LEDs 16GL and 16GD mounted on the second sub-pixel 16G, the number of normally mounted micro LEDs 16GL may be 3.

The micro LEDs 16RL and 16RD disposed in the first sub-pixel 16R in each of the pixels 1600 and 1600n may be micro LEDs emitting red light. Therefore, the first sub-pixel 16R becomes a sub-pixel that emits red light.

The spaces between the micro LEDs 16RL and 16RD present in the first sub-pixel 16R of the pixel 1600 may be the same or different from each other. Further, the micro LEDs 16RL, 16RD, 16GL, 16GD, 16BL, and 16BD in each sub-pixel 16R, 16G, and 16B may or may not be aligned in a line. Among the micro LEDs 16RL, 16RD, 16GL, 16GD, 16BL, and 16BD mounted on each sub-pixel 16R, 16G, and 16B, some micro LEDs 16RL, 16GL, and 16BL are correctly mounted micro LEDs, and the remaining micro LEDs 16RD, 16GD, and 16BD are incorrectly, i.e., upside down, mounted micro LEDs. Here, "correctly mounted micro LED" refers to a micro LED that emits light normally when a voltage for the operation of a micro LED is applied. The micro LEDs 16RD, 16GD, and 16BD mounted upside down do not emit light even when the operating voltage is applied. Therefore, the micro LEDs 16RD, 16GD, and 16BD mounted upside down may be referred to as dummy micro LEDs or dummy patterns. These descriptions of the micro LEDs 16RL, 16RD, 16GL, 16GD, 16BL, and 16BD mounted on each sub-pixel 16R, 16G, and 16B of the pixel 1600 may be applied to sub-pixels of other pixels.

Figure 17:
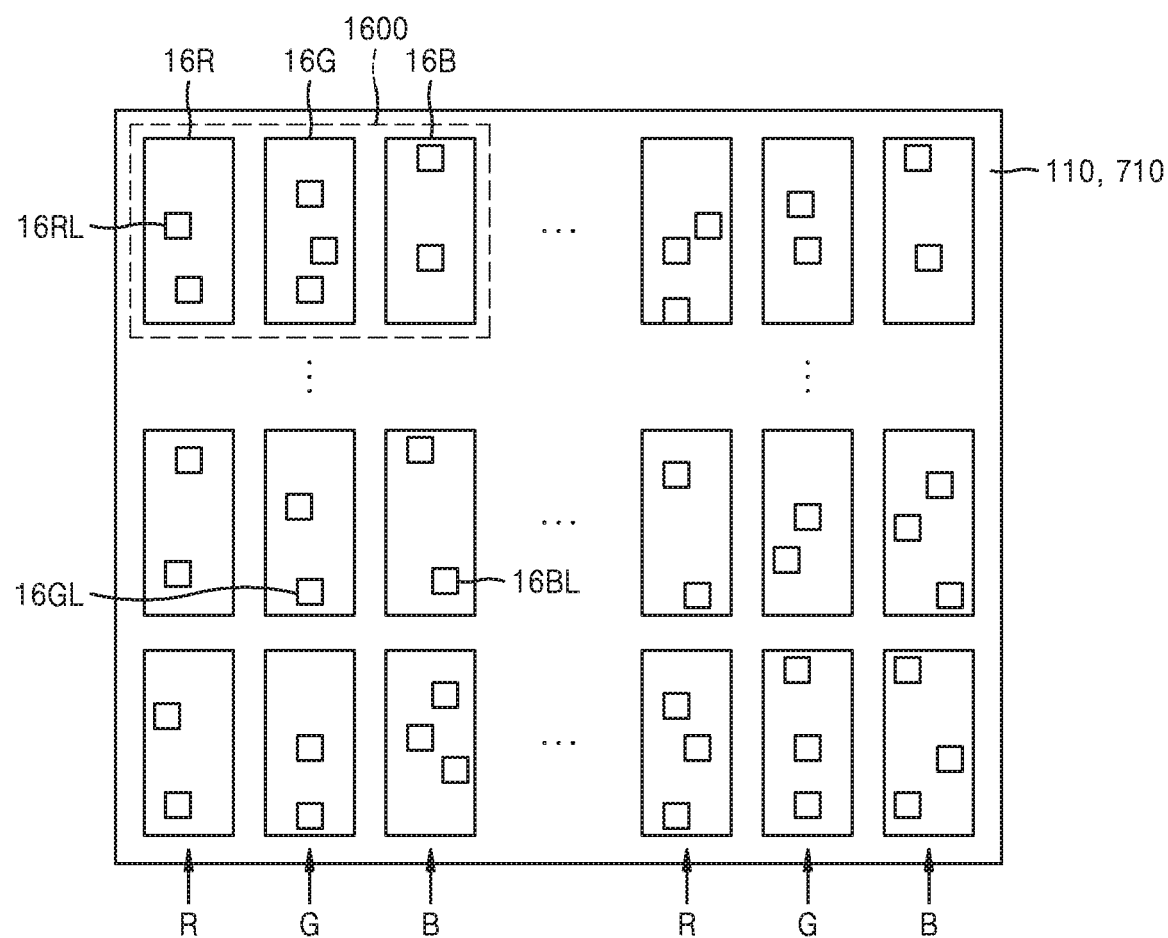
FIG. 17 is a plan view illustrating a case in which only micro LEDs mounted upside down are selectively removed from each sub-pixel of FIG. 16 and only micro LEDs correctly mounted remain in each sub-pixel.

As shown in FIG. 16, after the micro LEDs 16RL, 16RD, 16GL, 16GD, 16BL, and 16BD are mounted on the pixels 1600 and 1600n, specific micro LEDs may be selectively removed from each sub-pixel 16R, 16G, and 16B through a pre-bonding process. For example, when the pre-bonding process is performed on each sub-pixel 16R, 16G, and 16B so that the adhesion force of the micro LEDs 16RL, 16GL, and 16BL correctly mounted is higher than that of the micro LEDs 16RD, 16GD, and 16BD mounted upside down, only the micro LEDs 16RD, 16GD, and 16BD mounted upside down may be selectively removed from each sub-pixel 16R, 16G, and 16B. FIG. 17 shows this result. That is, incorrectly transferred micro LEDs 16RD, 16GD, and 16BD may be removed.

Figure 18:
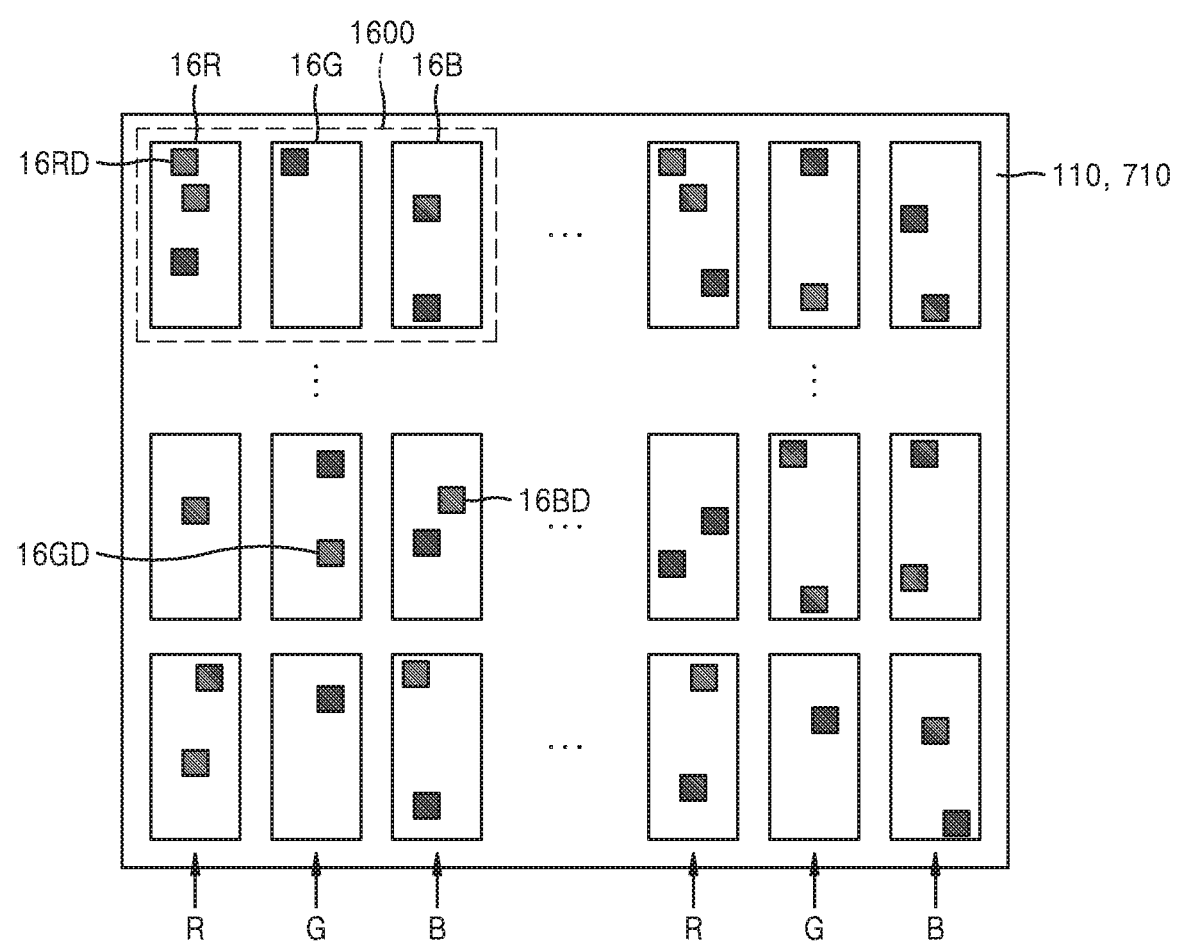
FIG. 18 is a plan view showing a case in which only micro LEDs correctly mounted are selectively removed from each sub-pixel of FIG. 16 and only the micro LEDs mounted upside down remain in each sub-pixel.

Conversely, when the micro LEDs 16RL, 16GL, and 16BL correctly mounted are removed from each sub-pixel 16R, 16G, and 16B, and only the micro LEDs 16RD, 16GD, and 16BD mounted upside down are to be used, the pre-bonding process may be performed so that the adhesion force of the micro LEDs 16RD, 16GD, and 16BD mounted upside down relatively increases. As a result, as shown in FIG. 18, only the micro LEDs 16RL, 16GL, and 16BL correctly mounted are selectively removed from each sub-pixel 16R, 16G, and 16B, and only the micro LEDs 16RD, 16GD, and 16BD mounted upside down remain in each sub-pixel 16R, 16G, and 16B. Through this pre-bonding, the directionality of the transferred micro LED may be selected.

Figure 19:
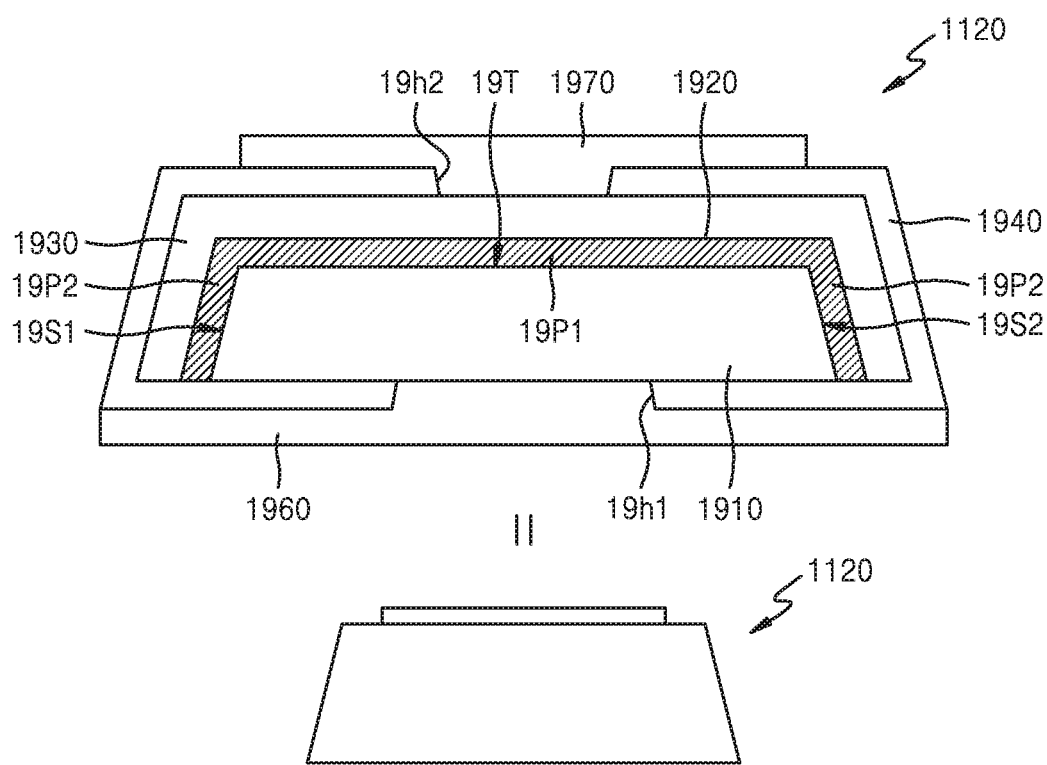
FIG. 19 is a cross-sectional view showing an example of a micro LED transferred by using the micro LED transfer methods of FIGS. 11 to 15.

FIG. 19 shows an example of the micro LED 1120 transferred by using the micro LED transfer methods of FIGS. 11 to 15.

Referring to FIG. 19, the micro LED 1120 may include a first semiconductor layer 1910, an active layer 1920, and a second semiconductor layer 1930. The first and second semiconductor layers 1910 and 1930 may be semiconductor layers of opposite types. That is, one of the first and second semiconductor layers 1910 and 1930 may be a P-type semiconductor layer and the other may be an N-type semiconductor layer. For example, the first semiconductor layer 1910 may be a compound semiconductor layer doped with N-type impurities, and the second semiconductor layer 1930 may be a compound semiconductor layer doped with P-type impurities. The first and second semiconductor layers 1910 and 1930 may be compound semiconductor layers or may include compound semiconductor layers. For example, the compound semiconductor layer may be a GaN layer, and may include a group III-V compound semiconductor layer. The active layer 1920 may be a light emitting layer or may include a light emitting layer. For example, the active layer 1920 may include a light emitting layer that emits red light, green light, or blue light. In an example, the active layer 1920 may be a material layer having a multi-quantum well (MQW). The first semiconductor layer 1910 may have a rhombus cross-section. The active layer 1920 is formed on an upper surface 19T and both side surfaces 19S1 and 19S2 of the rhombus-shaped first semiconductor layer 1910. The active layer 1920 may include a first portion 19P1 covering the upper surface 19T of the first semiconductor layer 1910 and a second portion 19P2 covering the side surfaces 19S1 and 19S2 of the first semiconductor layer 1910. The first portion 19P1 may cover the entire upper surface 19T of the first semiconductor layer 1910. Light may be emitted from the first portion 19P1 in the first direction. The first direction may be a direction perpendicular to the longitudinal direction of the first portion 19P1. Here, the "perpendicular direction" may include not only a direction orthogonal to the longitudinal direction of the first portion 19P1, but also a direction inclined at an angle smaller than 45° to the left and right in the orthogonal direction. The second portion 19P2 may cover the entire side surfaces 19S1 and 19S2 of the first semiconductor layer 1910. The second portion 19P2 may be a portion extended from both ends of the first portion 19P1 onto the both sides 19S1 and 19S2 of the first semiconductor layer 1910. The light may be emitted from the second portion 19P2 in the second direction. The second direction may be a different direction from the first direction. The thickness of the active layer 1920 may be uniform throughout. The first portion 19P1 of the active layer 1920 may be parallel to the upper surface 19T of the first semiconductor layer 1910. The second portion 19P2 of the active layer 1920 may be parallel to the side surfaces 19S1 and 19S2 of the first semiconductor layer 1910. The second semiconductor layer 1930 is formed on the upper and side surfaces of the active layer 1920. The second semiconductor layer 1930 may cover the entire active layer 1920. A corner portion where the first portion 19P1 and the second portion 19P2 of the active layer 1920 meet is also covered with and protected by the second semiconductor layer 1930. The upper surface of the second semiconductor layer 1930 may be parallel to the upper surface of the first portion 19P1 of the active layer 1920. Both sides of the second semiconductor layer 1930 may be parallel to both sides of the active layer 1920, that is, the second portion 19P2.

As a result, the entire first semiconductor layer 1910 is covered with the active layer 1920 except for the bottom surface, and most of the surface of the active layer 1920 is covered with the second semiconductor layer 1930. That is, the first semiconductor layer 1910, the active layer 1920, and the second semiconductor layer 1930 sequentially stacked have a layer structure in which the upper layer surrounds the lower layer. For convenience, this layer structure is referred to as a core-shell structure. In the core-shell structure, as described above, side surfaces and corner portions of the active layer 1920 are protected by the second semiconductor layer 1930. A micro LED having the above-described core-shell structure may be formed by growing on a crystallized membrane (e.g., an $Al_2O_3$ layer).

In order to mount a plurality of micro LEDs on a unit pixel, the size of an LED needs to be reduced. As the size of the LED is reduced to the micro LED, the light emission efficiency is reduced. However, as shown in FIG. 19, by forming the micro LED to have the core-shell structure, the side surfaces and the corner portions of the active layer 1920 are naturally protected by the second semiconductor layer 1930 and are not exposed. Accordingly, even when the size of the LED is reduced to the size of the micro LED, the reduction in the light emission efficiency may be mitigated. That is, as the micro LED 1120 has the core-shell structure, a rapid reduction in the light emission efficiency due to the size reduction of the LED is prevented. The size of the micro LED 1120 illustrated in FIG. 19 may be about 50 μm×50 μm, but is not limited to this value.

Subsequently, a stack including the first semiconductor layer 1910, the active layer 1920, and the second semiconductor layer 1930 forming the core-shell structure is surrounded by an insulating layer 1940. That is, the insulating layer 1940 is formed on side surfaces and a portion of the upper surface of the second semiconductor layer 1930. The insulating layer 1940 may extend on the bottom surface of the second semiconductor layer 1930, the bottom surface of the active layer 1920, and a portion of the bottom surface of the first semiconductor layer 1910. Except for a part of the bottom surface of the first semiconductor layer 1910 and a part of the top surface of the second semiconductor layer 1930, the entire surface of the stack is covered with the insulating layer 1940. The insulating layer 1940 may be in direct contact with the corresponding surface of a material layer that is covered with the insulating layer 1940. That is, the insulating layer 1940 may be in direct contact with the top, side, and bottom surfaces of the second semiconductor layer 1930, and may be in direct contact with the bottom surface of the active layer 1920 and the bottom surface of the first semiconductor layer 1910.

The insulating layer 1940 may be an oxide layer or a nitride layer, for example, a silicon oxide layer or a silicon nitride layer. The insulating layer 1940 may be used as a protective layer protecting the micro LED. The insulating layer 1940 includes a first contact hole 19$h$1 exposing a part of the bottom surface of the first semiconductor layer 1910 and a second contact hole 19$h$2 exposing a part of the upper surface of the second semiconductor layer 1930. A first electrode layer 1960 filling the first contact hole 19$h$1 is provided on the bottom surface of the insulating layer 1940. A second electrode layer 1970 filling the second contact hole 19$h$2 is present on the upper surface of the insulating layer 1940. One of the first electrode layer 1960 and the second electrode layer 1970 may be a P-type electrode layer contacting a P-type semiconductor layer, and the other may be an N-type electrode layer directly contacting an N-type semiconductor layer. For example, the first electrode layer 1960 may be an N-type electrode layer, and the second electrode layer 1970 may be a P-type electrode layer. At least one of the first and second electrode layers 1960 and 1970 may be a material layer that is transparent to light and has conductivity. For example, an electrode layer formed in a direction in which light is emitted from the micro LEDs 16RL, 16RD, 16GL, 16GD, 16BL, and 16BD may be a transparent material layer. For example, the first and second electrode layers 1960 and 1970 may be Indium Tin Oxide (ITO) layers.

The micro LED 1120 of FIG. 19 has a structure in which the first and second electrode layers 1960 and 1970 are vertically stacked or vertically distributed. In other words, the first and second electrode layers 1960 and 1970 may face up and down with respect to the active layer 1920. The first electrode layer 1960 is provided below the active layer 1920, and the second electrode layer 1970 is provided on the active layer 1920. Accordingly, the micro LED 1120 of FIG. 19 is referred to as a vertical electrode micro LED.

Meanwhile, for convenience of illustration, in the remaining drawings the micro LED 1120 shown in FIG. 19 is replaced with a drawing indicated by the equivalent (=) shown in the lower portion of FIG. 19.

Figure 20:
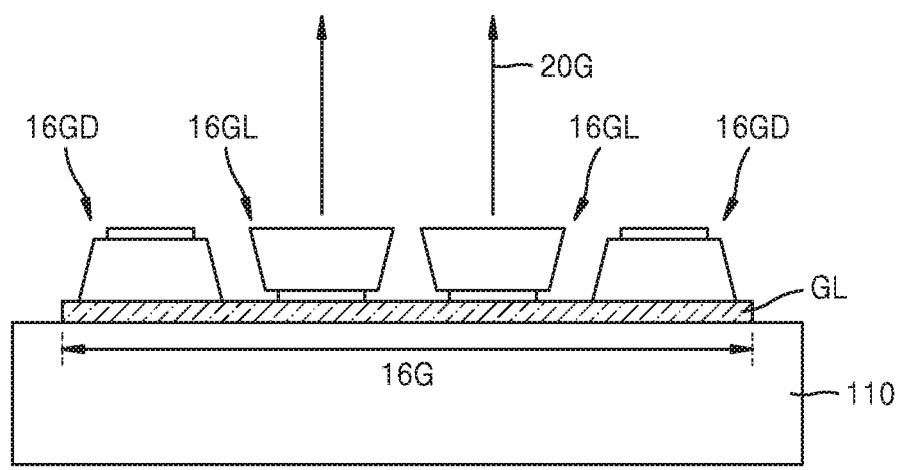
FIG. 20 is a cross-sectional view showing FIG. 16 taken along a 20-20' direction when no bank is present in the perimeter of sub-pixels on a substrate.

FIG. 20 is a cross-sectional view of FIG. 16 taken along a 20-20' direction when no bank is present in the perimeter of sub-pixels on a substrate.

Referring to FIG. 20, the second wiring layer GL is provided on the substrate 110, and the four micro LEDs 16GL and 16GD are disposed on the second wiring layer GL. The spaces between the four micro LEDs 16GL and 16GD may or may not be constant. Among the four micro LEDs 16GL and 16GD, the two micro LEDs 16GL are correctly disposed, and the other two micro LEDs 16GD are disposed upside down. In the case of the micro LED 16GL normally aligned, the second electrode layer 1970 in FIG. 19 is positioned on a bottom side, and the first electrode layer 1960 in FIG. 19 is positioned on a top side such that the second electrode layer 1970 is in direct contact with the second wiring layer GL. When an operating voltage is applied to the micro LED 16GL normally mounted, normal light, that is, green light 20G, is emitted from the micro LED 16GL. However, in the case of the micro LED 16GD abnormally mounted, as opposed to that of the micro LED 16GL normally mounted, the first electrode layer 1960 is in contact with the second wiring layer GL, and thus the micro LED 16GD abnormally mounted does not operate even when the operating voltage is applied to the micro LED 16GD abnormally mounted. Therefore, the light is not emitted from the micro LED 16GD abnormally mounted.

Figure 21:
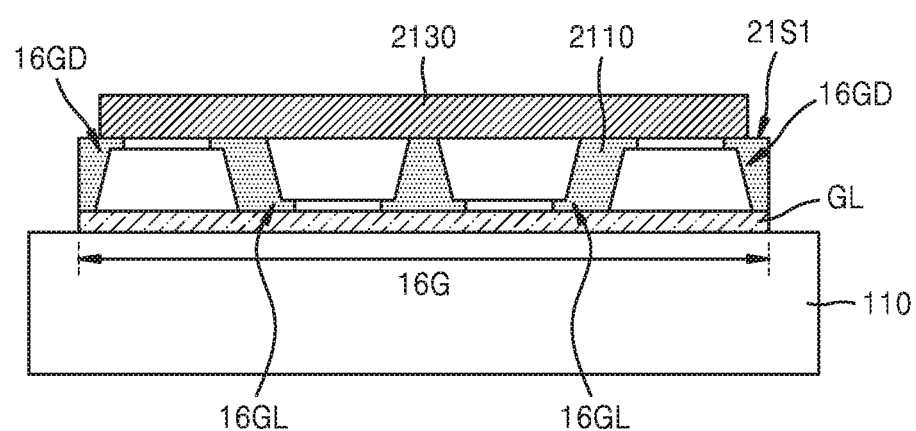
FIG. 21 is a cross-sectional view showing a case where all of the transferred micro LEDs are in contact with an electrode wiring and surrounded by a passivation layer in FIG. 20.

After the micro LEDs 16GL and 16GD are mounted on the second wiring layer GL, as shown in FIG. 21, a passivation layer 2110 surrounding the micro LEDs 16GL and 16GD may be formed on the second wiring layer GL. The passivation layer 2110 may be an insulating material layer transparent to light. For example, the passivation layer 2110 may be a silicon oxide layer. The passivation layer 2110 may cover the entire second wiring layer GL on the perimeter of the micro LEDs 16GL and 16GD. The passivation layer 2110 may fill spaces between the micro LEDs 16GL and 16GD. Accordingly, the micro LEDs 16GD and 16GL transferred on the second wiring layer GL may be buried in the passivation layer 2110 except for the exposed upper surfaces. The height of the upper surface 21S1 of the passivation layer 2110 may be the same as the height of the upper surfaces of the micro LEDs 16GD and 16GL. In an example, the height of the upper surface 21S1 of the passivation layer 2110 may be lower than the height of the upper surfaces of the micro LEDs 16GD and 16GL. Accordingly, after the passivation layer 2110 is formed, the upper surfaces of all the transferred micro LEDs 16GD and 16GL are exposed. An electrode wiring 2130 is provided on the passivation layer 2110 and the micro LEDs 16GD and 16GL. The electrode wiring 2130 covers the entire upper surfaces of the micro LEDs 16GD and 16GL. The electrode wiring 2130 may cover the entire upper surface 21S1 of the passivation layer 2110 on the perimeter of the upper surfaces of the micro LEDs 16GD and 16GL. The electrode wiring 2130 may be in contact with all the micro LEDs 16GD and 16GL transferred on the second wiring GL. The electrode wiring 2130 may contact the upper surfaces of all the transferred micro LEDs 16GD and 16GL. Although the electrode wiring 2130 is provided to contact the upper surfaces of all the micro LEDs 16GD and 16GL, the upper surfaces of the micro LEDs 16GL normally transferred and the micro LEDs 16GD abnormally transferred are different from each other. That is, the polarities of the two upper surfaces are different. Therefore, even when the operating voltage is applied to the micro LEDs 16GD and 16GL through the electrode wiring 2130, light (e.g., green light) is emitted only from the micro LEDs 16GL correctly transferred, and the light is not emitted from the micro LEDs 16GD transferred upside down.

As a result, the desired light may be emitted only from the micro LEDs 16GL correctly transferred among the micro LEDs 16GD and 16GL transferred on the second wiring GL.

The electrode wiring 2130 may be a material layer that is transparent to light and has conductivity. For example, the electrode wiring 2130 may be ITO wiring.

Meanwhile, the micro LEDs 16GL correctly mounted may not include the first electrode layer 1960 in the light emission direction. In this case, the first semiconductor layer (1910 of FIG. 19) of the micro LED 16GL may be an upper surface. Therefore, the electrode wiring 2130 may be directly connected to the first semiconductor layer 1910 of the micro LED 16GL.

Figure 22:
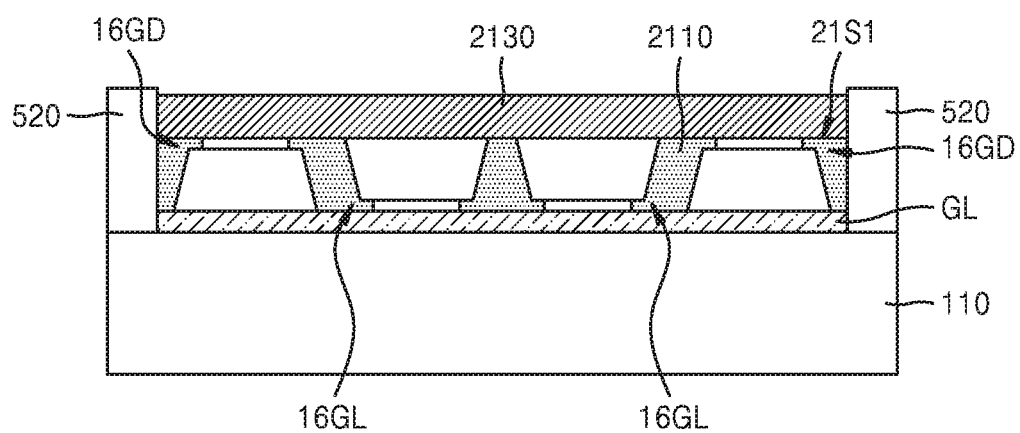
FIG. 22 is a cross-sectional view showing a case where a bank is provided along with a second wiring layer on a substrate in the case of FIG. 20.

FIG. 22 shows a case in which the banks 520 are provided along with the second wiring layer GL on the substrate 110 in the case of FIG. 20.

Figure 23:
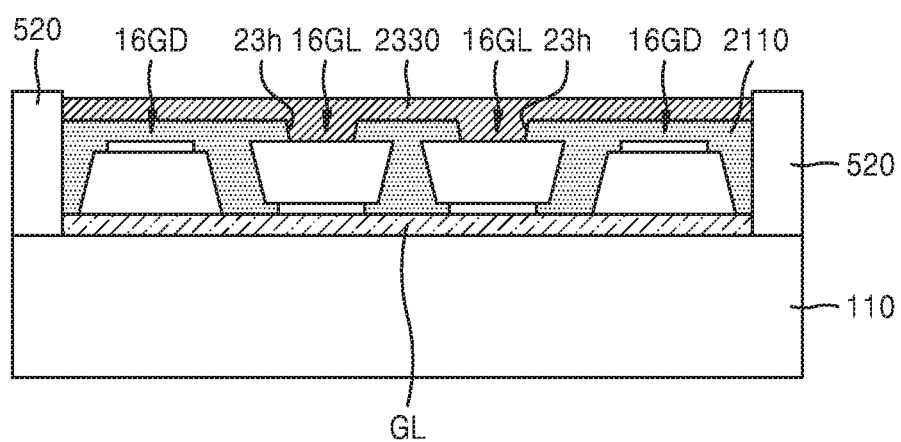
FIG. 23 is a cross-sectional view showing a case where all of the transferred micro LEDs are in contact with an electrode wiring and surrounded by a passivation layer in FIG. 22.

Referring to FIG. 22, the banks 520 are spaced apart from each other on the substrate 110. The bank 520 may define a region in which the second wiring layer GL is formed. That is, the bank 520 may serve to define a sub-pixel region. Because pixels include R, G, and B sub-pixels, the bank 520 may be regarded as serving to define a pixel region. The second wiring layer GL is formed on the upper surface of the substrate 110 between the banks 520, and the micro LEDs 16GL and 16GD are provided on the second wiring layer GL, as in FIG. 20. The micro LEDs 16GL and 16GD are surrounded by the passivation layer 2110, as shown in FIG. 23. The passivation layer 2110 may cover the entire second wiring layer GL on the perimeter of the micro LEDs 16GL and 16GD between the banks 520. The passivation layer 2110 may fill between the micro LEDs 16GL and 16GD. The passivation layer 2110 may fill between the bank 520 and the micro LED 16GD. The configuration of FIG. 23 may be the same as the configuration of FIG. 21 except that the bank 520 is provided. Therefore, the alignment and contact relationship between the passivation layer 2110, the micro LEDs 16GD, and 16GL and the electrode wiring 2130 between the banks 520 may be the same as described in FIG. 21.

Meanwhile, as described with reference to FIGS. 7 to 9, when the first and second wiring layers 720 and 730 are formed on the bottom of the first to third sub-pixel regions SP1', SP2', and SP3' of the pixel region 120, at least the electrode alignment of the micro LEDs having a core-shell structure, which are transferred to the first to third sub-pixel regions SP1', SP2', and SP3' of the pixel region 120 by using an inkjet injection method may be different from that of the first and second electrode layers 1960 and 1970 of FIG. 19.

Figure 24:
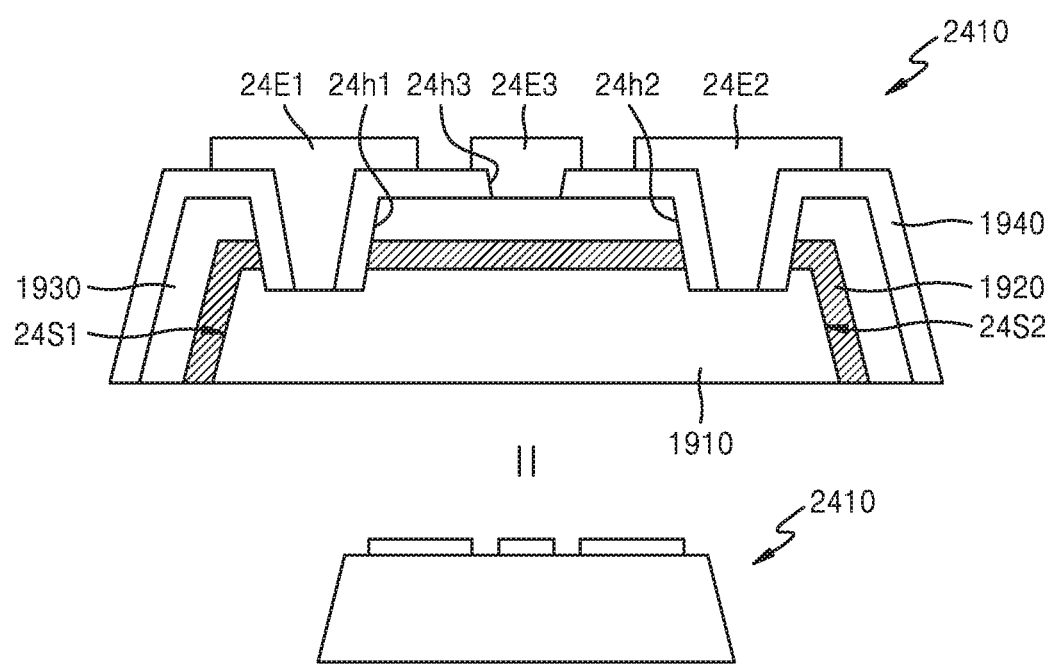
FIG. 24 is a cross-sectional view showing an example of a micro LED transferred to first to third sub-pixel regions illustrated in FIGS. 7 to 9.

FIG. 24 shows an example of a micro LED 2410 transferred to the first to third sub-pixel regions SP1', SP2', and SP3' of the pixel region 120 illustrated in FIGS. 7 to 9.

Referring to FIG. 24, the micro LED 2410 includes first to third electrodes 24E1, 24E2, and 24E3. The stack structure of the first semiconductor layer 1910, the second semiconductor layer 1930 and the active layer 1920 forming a core-shell structure in the micro LED 2410 may be the same as that of FIG. 19. The first to third electrodes 24E1, 24E2, and 24E3 may be disposed on one side of the micro LED 2410. For example, the first to third electrodes 24E1, 24E2, and 24E3 may be provided on the opposite side of the first semiconductor layer 1910 with respect to the active layer 1920. That is, the first to third electrodes 24E1, 24E2, and 24E3 may be positioned on the upper surface of the second semiconductor layer 1930 as shown in FIG. 24. The first and second electrodes 24E1 and 24E2 may be N-type electrode layers contacting the first semiconductor layer 1910. The third electrode 24E3 may be a P-type electrode layer contacting the second semiconductor layer 1930.

First and second trenches 24h1 and 24h2 are formed in the stack structure including the first semiconductor layer 1910, the active layer 1920, and the second semiconductor layer 1930. The first trench 24h1 and the second trench 24h2 are spaced apart from each other. The bottoms of the first and second trenches 24h1 and 24h2 are positioned between both side surfaces 24S1 and 24S2 of the first semiconductor layer 1910. The first and second trenches 24h1 and 24h2 are formed in the upper surface of the second semiconductor layer 1930 toward the first semiconductor layer 1910. In other words, the first and second trenches 24h1 and 24h2 sequentially penetrate through the second semiconductor layer 1930 and the active layer 1920. The first and second trenches 24h1 and 24h2 further extend into the first semiconductor layer 1910 by a predetermined thickness. Accordingly, a groove that is a part of the first and second trenches 24h1 and 24h2 exists in a portion corresponding to the first and second trenches 24h1 and 24h2 of the first semiconductor layer 1910. The groove becomes a lower end including the bottoms of the first and second trenches 24h1 and 24h2. The insulating layer 1940 is formed on the upper and side surfaces of the second semiconductor layer 1930. The insulating layer 1940 covers the entire upper surface of the second semiconductor layer 1930 on the perimeter of the first and second trenches 24h1 and 24h2. The insulating layer 1940 may also cover the entire side surfaces of the second semiconductor layer 1930. The insulating layer 1940 fills a portion of the first and second trenches 24h1 and 24h2. That is, the insulating layer 1940 covers the inner side surfaces of the first and second trenches 24h1 and 24h2, and also covers a part of the bottom. The insulating layer 1940 covers only a part of the bottom of each of the first and second trenches 24h1 and 24h2, and thus the remaining part of the bottom of each of the first and second trenches 24h1 and 24h2, i.e., a part of the first semiconductor layer 1910, is exposed through the first and second trenches 24h1 and 24h2. The remaining part of the first trench 24h1 is filled with the first electrode 24E1. That is, the first electrode 24E1 fills the remaining part of the first trench 24h1 and is also formed on a part of the insulating layer 1940 on the perimeter of the first trench 24h1. The remaining part of the second trench 24h2 is filled with the second electrode 24E2. That is, the second electrode 24E2 fills the second trench 24h2 and is also formed on a part of the insulating layer 1940 on the perimeter of the second trench 24h2. The first and second electrodes 24E1 and 24E2 are spaced apart from each other.

The insulating layer 1940 includes a via hole 24h3. The via hole 24h3 may be positioned between the first and second trenches 24h1 and 24h2. A part of the second semiconductor layer 1930 is exposed through the via hole 24h3. The via hole 24h3 is filled with the third electrode 24E3. The third electrode 24E3 is in contact with the exposed part of the second semiconductor layer 1930 through the via hole 24h3. The third electrode 24E3 fills the via hole 24h3 and is also formed on a part of the insulating layer 1940 on the perimeter of the via hole 24h3. The third electrode 24E3 is disposed between the first and second electrodes 24E1 and 24E2. The third electrode 24E3 is spaced apart from the first and second electrodes 24E1 and 24E2. The heights of the upper surfaces of the first to third electrodes 24E1, 24E2, and 24E3 may be the same. The first to third electrodes 24E1, 24E2, and 24E3 are all formed on the same side of the micro LED 2410, and the micro LED 2410 having such an electrode alignment structure is referred to as a horizontal electrode micro LED.

Meanwhile, for convenience of illustration, in the remaining drawings the micro LED 2410 shown in FIG. 24 is replaced with a simple drawing indicated by the equivalent (=) at a bottom portion of FIG. 24.

Next, a process of transferring the micro LED 2410 illustrated in FIG. 24 to each pixel region 120 of the pixel array panel 100 by using the inkjet injection method will be described with reference to FIGS. 25 to 27. The sub-pixel regions of each pixel region 120 may be the same as described in FIGS. 7 to 9.

Figure 25:
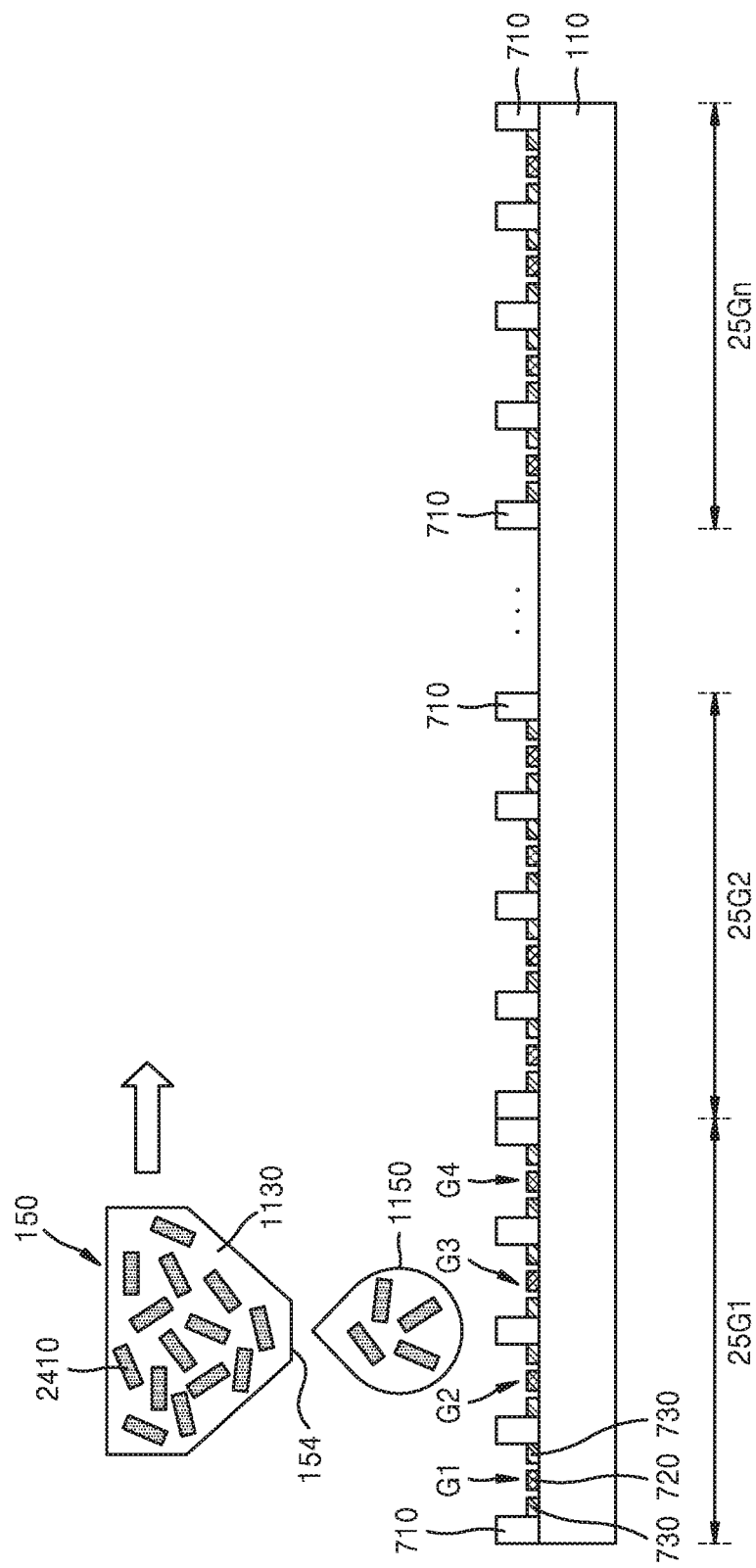
FIGS. 25 to 27 are cross-sectional views showing processes of transferring a micro LED to each pixel while moving an inkjet head in a traveling direction (Y-axis direction) of the inkjet head, i.e., in a direction parallel to the 8-8' direction of FIG. 7, with respect to a pixel array panel of FIG. 1, according to operations.
Figure 26:
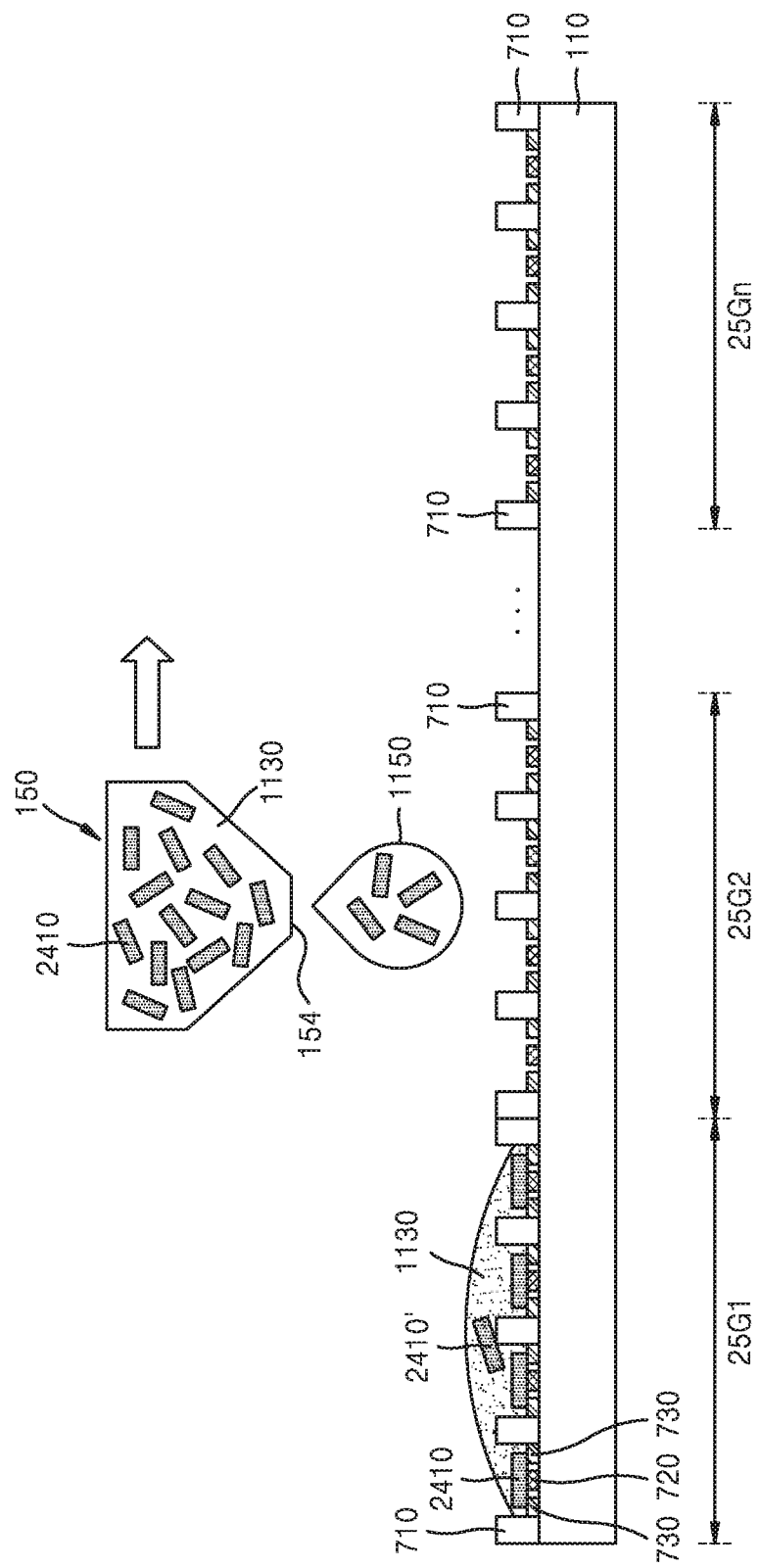
Figure 27:
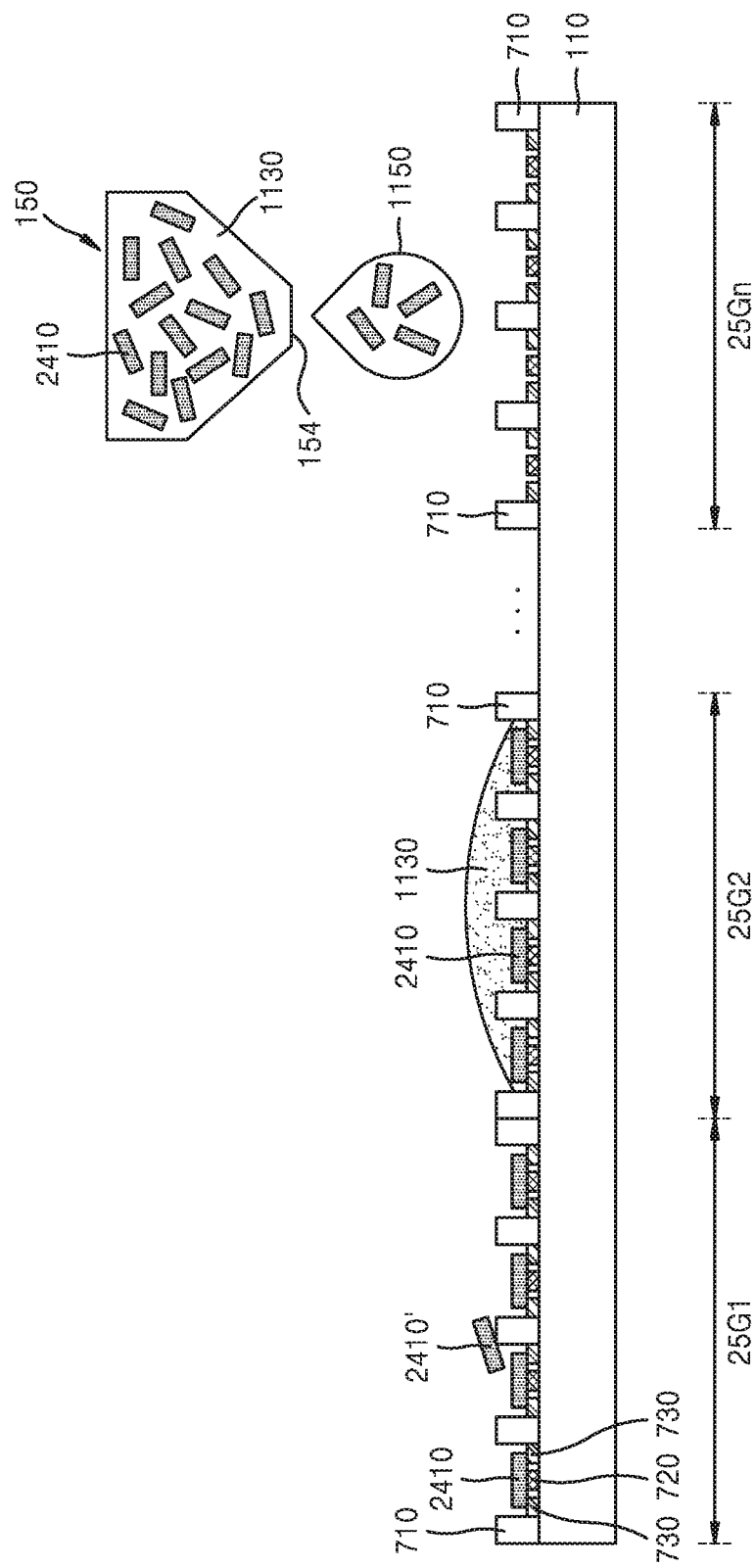

FIGS. 25 to 27 show a process of transferring the micro LED 2410 illustrated in FIG. 24 to each pixel while moving the first inkjet head 150 in a traveling direction (Y-axis direction) of the first inkjet head 150, i.e., in a direction parallel to the 8-8' direction of FIG. 7, with respect to the pixel array panel 100 of FIG. 1, according to operations.

Referring to FIG. 25, the first inkjet head 150 is positioned on a second sub-pixel region 25G1 of a first pixel of the substrate 110. A drop of the micro LED droplets 1150 is sprayed (dropped) from the first inkjet head 150 into the second sub-pixel region 25G1. The micro LED droplets 1150 may include the plurality of micro LEDs 2410, for example, one to six micro LEDs 2410. The micro LED droplets 1150 are sprayed on the second sub-pixel region 25G1 and, as illustrated in FIG. 26, the micro LEDs 2410 may be aligned in the first to fourth regions G1, G2, G3, and G4 of the second sub-pixel region 25G1 one by one. Each of the first to fourth regions G1, G2, G3, and G4 may have the size in which one micro LED 2410 may be mounted. Therefore, two micro LEDs 2410 may not be mounted on any one of the first to fourth regions G1 to G4. When the number of micro LEDs 2410 included in the micro LED droplets 1150 is greater than the number of regions G1 to G4 included in the second sub-pixel region 25G1, an extra micro LED 2410' may be placed on the mold 710 between the regions G1 to G4. As such, the micro LED 2410' that are not mounted on each region G1 to G4 and placed outside the regions G1 to G4 may be removed in a subsequent process. The subsequent process may be a process of removing an abnormally mounted micro LED after a micro LED transfer for a given region or section of the pixel array panel 100 is completed. The solution 1130 covering the first sub-pixel region 25G1 is volatilized.

After the micro LED 2410 is transferred to the first to fourth regions G1, G2, G3, and G4 of the second sub-pixel region 25G1 of the first pixel, as shown in FIG. 26, the first inkjet head 150 may be moved onto a second sub-pixel region 25G2 of the second pixel next to the first pixel. Subsequently, the first inkjet head 150 is aligned to a position suitable for spraying the micro LED droplets 1150 to the second sub-pixel region 25G2. The movement and the alignment may be continuous, but may not. The movement and the alignment may be performed in one operation, but may not.

The spraying of the micro LED droplets 1150 using the first inkjet head 150 may be performed in a similar or the same manner as the spraying of ink from an inkjet head of an inkjet printer.

After the first inkjet head 150 is aligned on the second sub-pixel region 25G2 of the second pixel, the micro LED droplets 1150 are dropped on the second sub-pixel region 25G2. By spraying the micro LED droplets 1150 on the second sub-pixel region 25G2, as shown in FIG. 27, the micro LEDs 2410 each may be transferred to the first to fourth regions G1, G2, G3, and G4 of the second sub-pixel region 25G2. This transfer process is performed to a second sub-pixel region 25Gn of an nth (n=1, 2, 3, . . . ) pixel.

After the micro LED transfer process on the second sub-pixel regions 25G1 to 25Gn of each pixel is completed, the micro LED transfer process on the first sub-pixel region or the third sub-pixel region of each pixel may be performed. The first sub-pixel region may be a sub-pixel region emitting red light. The second sub-pixel regions 25G1 to 25Gn may be sub-pixel regions emitting green light. The third sub-pixel region may be a sub-pixel region emitting blue light.

In an embodiment, the method of transferring the micro LED 2410 with respect to each pixel may be performed by using a plurality of inkjet heads together. In this case, the micro LED transfer to the first to third sub-pixel regions of each pixel may be performed simultaneously or sequentially. For example, three inkjet heads may be used together to transfer micro LEDs, and in this case, the types of the micro LEDs sprayed from each inkjet head may be different. The micro LED emitted from a first inkjet head may be a micro LED emitting red light, the micro LED emitted from a second inkjet head may be a micro LED emitting green light, and the micro LED emitted from a third inkjet head may be a micro LED emitting blue light.

The micro LED transfer using an inkjet head enables accurate transfer for each pixel, and may also be rapidly performed, which may increase the efficiency of micro LED transfer to a relatively large area pixel array panel.

Figure 28:
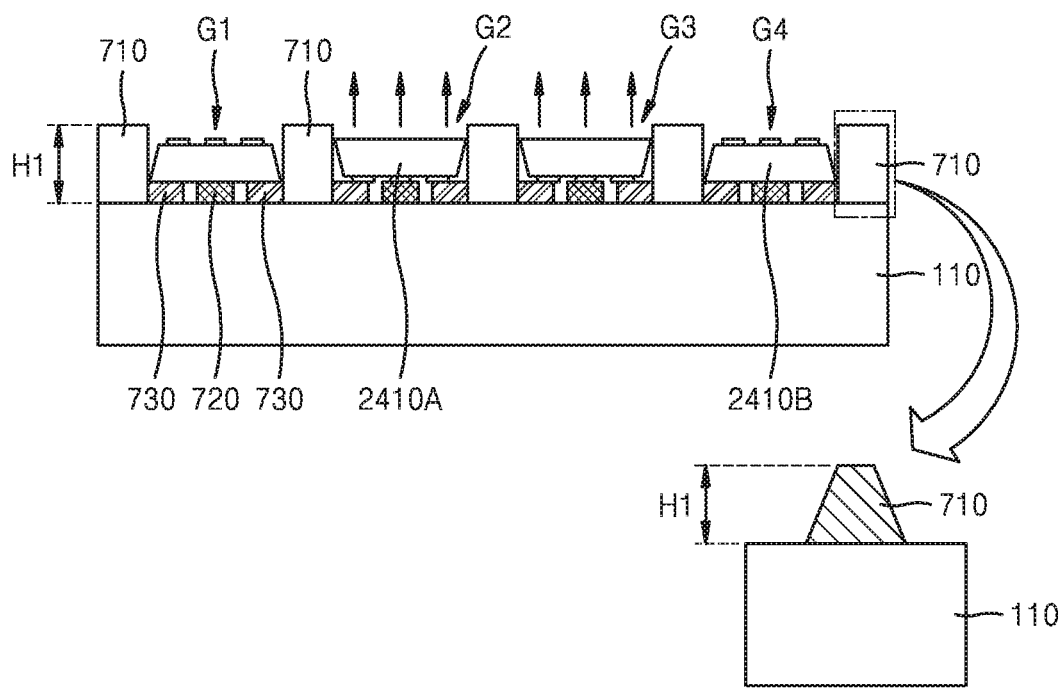
FIG. 28 is an enlarged view of a second sub-pixel region of a first pixel of FIG. 27.

FIG. 28 is an enlarged view of the second sub-pixel region 25G1 of the first pixel of FIG. 27.

Referring to FIG. 28, micro LEDs 2410B transferred to the first and fourth regions G1 and G4 are mounted such that an electrode is positioned at the top. Therefore, the electrode of the micro LEDs 2410B does not contact the first and second wiring layers 720 and 730 formed on the substrate 110 of the first region G1. As a result, the micro LEDs 2410B are upside down transferred (mounted) or abnormally transferred (mounted) micro LEDs. That is, the micro LEDs 24106 may be dummy micro LEDs.

Conversely, in micro LEDs 2410A transferred to the second and third regions G2 and G3, the micro LEDs 2410A are transferred such that the electrode is positioned at the bottom. That is, the micro LEDs 2410A are normally transferred. Therefore, the micro LEDs 2410A mounted on the second and third regions G2 and G3 are in contact with the first and second wiring layers 720 and 730. Therefore, when an operating voltage is applied to the micro LEDs 2410A, light (e.g., green light) may be emitted from the micro LEDs 2410A.

Meanwhile, the mold 710 defining the first to fourth regions G1, G2, G3, and G4 may have a shape to induce the micro LED 2410 transferred to each region G1, G2, G3, and G4 to be correctly mounted on each region G1, G2, G3, and G4. For example, the mold 710 may have a rhombus shape tapered upward as shown separately at a bottom portion of FIG. 28.

Figure 29:
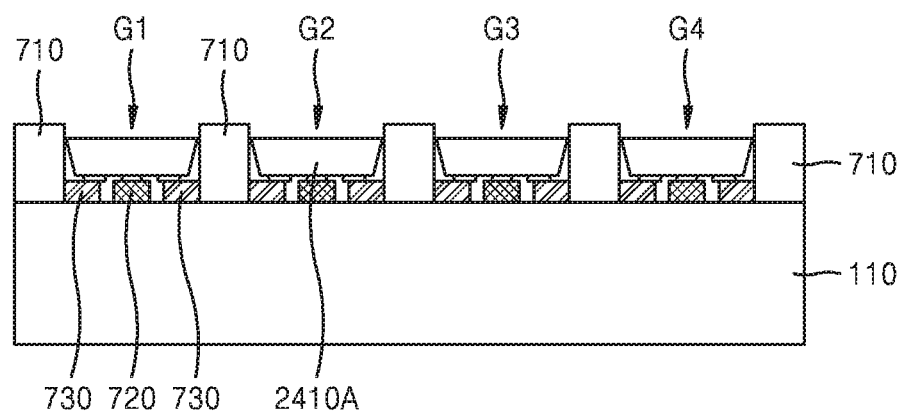
FIG. 29 is a cross-sectional view showing a case in which all micro LEDs transferred to first to fourth regions of a second sub-pixel region of a first pixel of FIG. 28 are correctly mounted.

FIG. 29 shows a case in which all the micro LEDs 2410A transferred to the first to fourth regions G1, G2, G3, and G4 are correctly mounted.

Figure 30:
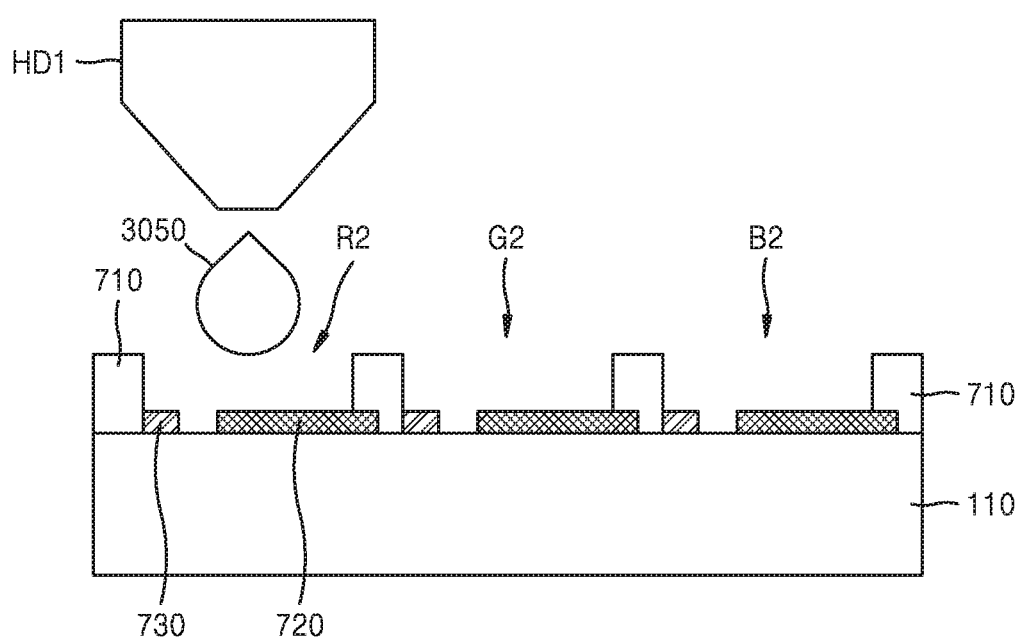
FIGS. 30 to 32 are cross-sectional views illustrating a process of transferring a horizontal electrode micro LED to different sub-pixel regions of each pixel according to operations in a micro LED transfer method according to an embodiment.
Figure 31:
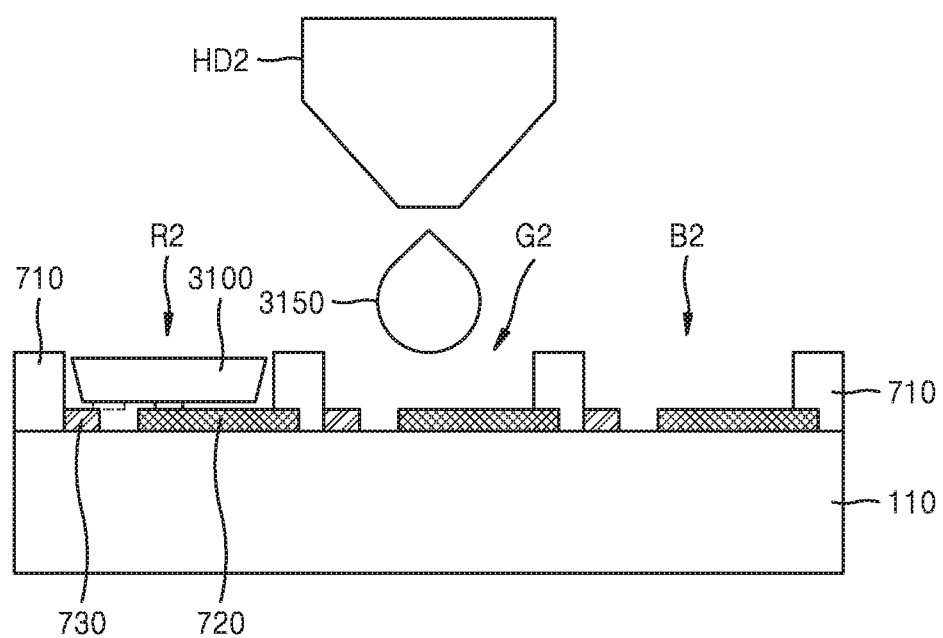
Figure 32:
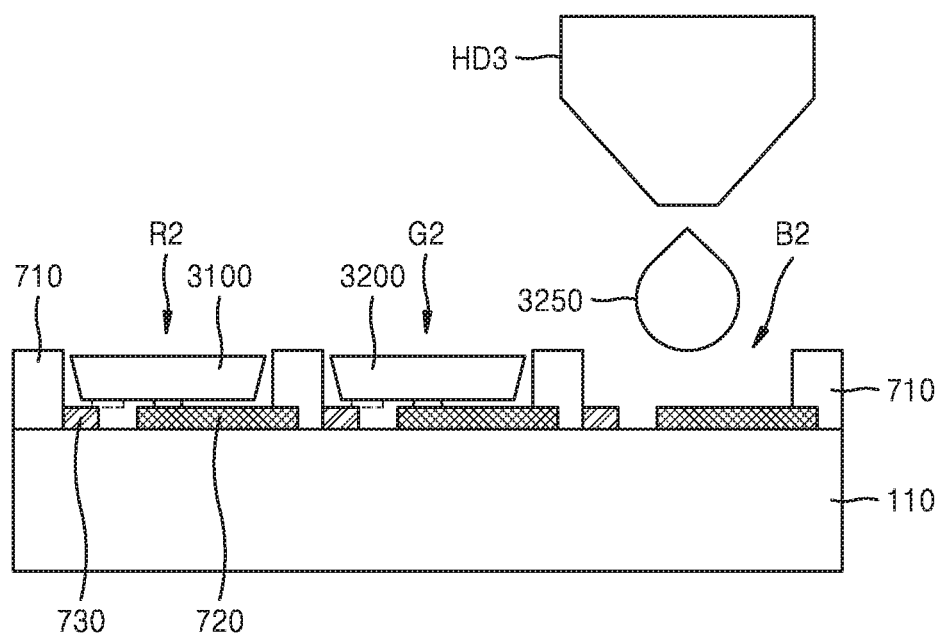

FIGS. 30 to 32 are cross-sectional views illustrating a process of transferring a horizontal electrode micro LED to different sub-pixel regions of each pixel according to operations. For convenience of illustration, an inkjet head and a micro LED included in micro LED droplets are omitted in each drawing.

First, as shown in FIG. 30, after a first inkjet head HD1 is aligned on the second region R2 of a first sub-pixel region of a selected pixel, a first micro LED droplet 3050 is sprayed on the second region R2. The first micro LED droplet 3050 may be a solution including the first micro LED. The first micro LED may be a micro LED emitting red light. Thereafter, the first inkjet head HD1 may be moved on a second region of a first sub-pixel region of another selected pixel, and may transfer the micro LED to the second region. The transfer process may be performed on second regions of first sub-pixel regions of other pixels.

Next, as shown in FIG. 31, after a second inkjet head HD2 is aligned on the second region G2 of a second sub-pixel region of the selected pixel, a second micro LED droplet 3150 is sprayed on the second region G2. The second micro LED droplet 3150 may include second micro LEDs different from the first micro LEDs. The second micro LED may be a micro LED emitting green light. The micro LED 3100 transferred to the second region R2 of the first sub-pixel region represents the micro LED transferred using the first inkjet head HD1 of FIG. 30.

The second inkjet head HD2 may be structurally the same as the first inkjet head HD1. The difference between the first inkjet head HD1 and the second inkjet head H2 is only a kind (e.g., color) of sprayed micro LEDs. After the micro LED transfer to the second region G2 of the second sub-pixel region of the selected pixel is completed, the second inkjet head HD2 is moved over a second region of a second sub-pixel region of another pixel, and then the micro LED droplet 3150 is dropped on the second region below and thus the micro LED may be transferred to the second region. Subsequently, the second micro LED may be transferred to the second region of the second sub-pixel region of other pixels by the same transfer method.

Next, as shown in FIG. 32, after a third inkjet head HD3 is aligned on the second region B2 of a third sub-pixel region of the selected pixel, a third micro LED droplet 3250 is dropped in the second region B2. The third inkjet head HD3 may be structurally the same as the first and second inkjet heads HD1 and HD2. The difference between the third inkjet head HD3 and the first and second inkjet heads HD1 and HD2 is only a kind (e.g., a color) of sprayed micro LEDs. However, if there is no significant difference in the micro LED transfer process and transfer efficiency, the structures of the first to third inkjet heads HD1 to HD3 may be different from each other. The third micro LED droplet 3250 may include third micro LEDs that are different from the first and second micro LEDs. The third micro LED may be a micro LED emitting blue light. After the micro LED transfer to the second region B2 of the third sub-pixel region of the selected pixel is completed, the third inkjet head HD3 is moved to the second regions of the third sub-pixel regions of other pixels and thus the micro LED transfer may be performed. In the same manner, the micro LED transfer to the second regions of the third sub-pixel regions of the remaining pixels may be performed. The micro LED 3200 mounted on the second region G2 of the second sub-pixel region represents the micro LED transferred by using the transfer method using the second inkjet head HD2 of FIG. 31.

Figure 33:
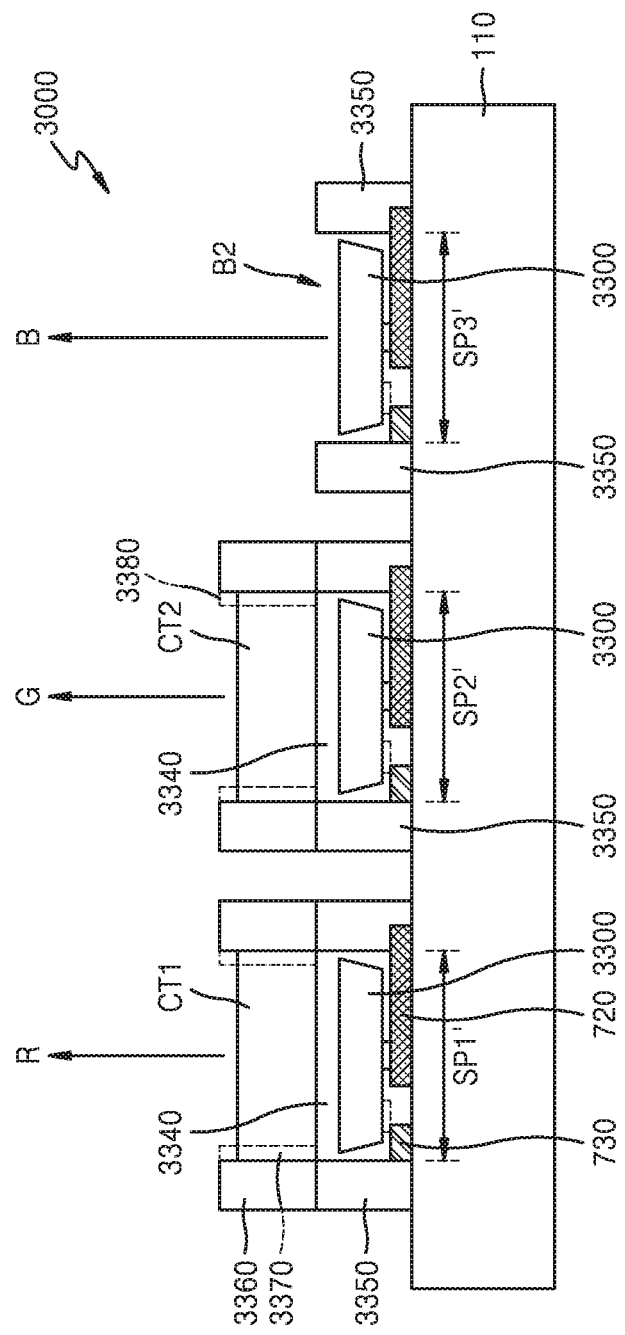
FIG. 33 shows a micro LED transfer method according to an embodiment.

FIG. 33 shows a micro LED transfer method using inkjet spray according to an embodiment.

Referring to FIG. 33, first micro LEDs 3300 are transferred to all the sub-pixel regions SP1', SP2', and SP3' of a pixel 3000. That is, the same micro LEDs are transferred to all the sub-pixel regions SP1', SP2', and SP3' included in the pixel 3000. The first to third sub-pixel regions SP1', SP2', and SP3' may be sub-pixel regions for horizontal electrode micro LED transfer. The first micro LEDs 3300 may be, for example, horizontal electrode micro LEDs emitting blue light B.

In an embodiment, the first to third sub-pixel regions SP1', SP2', and SP3' may be replaced with sub-pixel regions for vertical electrode micro LED transfer. In addition, the first micro LEDs 3300 may be replaced with vertical electrode micro LEDs.

The first micro LEDs 3300 may be transferred by using a transfer method using the inkjet head described above. The first sub-pixel region SP1' is a region emitting red light R. The second sub-pixel region SP2' is a region emitting green light G. Therefore, after the first micro LEDs 3300 are transferred, a subsequent process for emitting the red light R and the green light G from the first and second sub-pixel regions SP1' and SP2', respectively, may be performed. As an example, the first micro LED 3300 mounted on the first sub-pixel region SP1' and the first micro LED 3300 mounted on the second sub-pixel region SP2' are covered with a transparent and insulating passivation layer 3340. The passivation layer 3340 may be formed to fill the first and second sub-pixel regions SP1' and SP2' between first molds 3350 to completely cover at least the first and second wiring layers 720 and 730 and the first micro LED 3300. The structure and material of the first mold 3350 may be the same as the mold 710 described above. The upper surface of the passivation layer 3340 may be flat. The height of the upper surface of the passivation layer 3340 may be the same as or different from the height of the upper surface of the first mold 3350. As described above, the passivation layer 3340 is formed only in the first and second sub-pixel regions SP1' and SP2', and then a first light conversion material layer CT1 is formed on the passivation layer 3340 of the first sub-pixel region SP1', and a second light conversion material layer CT2 is formed on the passivation layer 3340 of the second sub-pixel region SP2'. The light conversion characteristics of the first and second light conversion material layers CT1 and CT2 are different. The first and second light conversion material layers CT1 and CT2 are formed between second molds 3360. In other words, regions in which the first and second light conversion material layers CT1 and CT2 are formed may be defined (determined) by the second mold 3360. The second mold 3360 may be regarded as a partition wall that prevents light interference between sub-pixel regions. The second mold 3360 may be located on the first mold 3350. The blue light B emitted from the first micro LED 3300 mounted on the first sub-pixel region SP1' is emitted through the first light conversion material layer CT1. The blue light B is converted into the red light R while passing through the first light conversion material layer CT1. To this end, the first light conversion material layer CT1 may include a member or a material (e.g., particles, quantum dots) that converts the blue light B into the red light R. The blue light B emitted from the first micro LED 3300 transferred to the second sub-pixel region SP2' is emitted through the second light conversion material layer CT2. In this process, the blue light B is converted to the green light G while passing through the second light conversion material layer CT2. To this end, the second light conversion material layer CT2 may include a member or a material (e.g., particles, quantum dots) that converts the blue light B into the green light G. In the light conversion process, light traveling in the lateral direction may be blocked by the second mold 3360. Accordingly, interference between the light emitted from each sub-pixel region SP1', SP2', and SP3' may be prevented. In order to prevent such light interference, a light absorbing layer 3370 may be provided between the second mold 3360 and the first and second light conversion material layers CT1 and CT2, as indicated by a dotted line.

According to an embodiment, a method of transferring micro LEDs to a pixel array panel of an LED display applies an inkjet printing method to accurately transfer micro LEDs to each pixel region using an inkjet head. In this transfer process, one inkjet head or a plurality of inkjet heads may be used sequentially or simultaneously, and thus micro LEDs may be sequentially or simultaneously transferred to a plurality of pixel regions or a plurality of sub-pixel regions. Therefore, when the micro LED transfer method according to an embodiment as described above is used, the micro LED may be quickly and accurately transferred to the pixel region or sub-pixel region to which the micro LED is to be transferred, thereby improving the transfer efficiency. In addition, when the micro LED transfer method is used, the time taken to transfer the micro LED to the pixel array panel for a large area LED display may also be shortened. In addition, since the main layers constituting the transferred micro LEDs form a core-shell structure, it is possible to prevent reduction in light emission efficiency due to the reduction in the size of the LEDs.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of transferring at least one micro light emitting diode (LED) to a pixel array panel comprising a plurality of sub-pixel regions on which the at least one micro LED is to be mounted, the method comprising:
    transferring the at least one micro LED by spraying using an inkjet method,
    wherein the transferring of the at least one micro LED comprises:
        dividing the plurality of sub-pixel regions into a plurality of groups; and
        transferring a plurality of micro LEDs to each group from among the plurality of groups.

2. The method of claim 1, wherein the transferring of the plurality of micro LEDs comprises:
    sequentially transferring the plurality of micro LEDs to each group from among the plurality of groups,
    wherein the sequentially transferring of the plurality of micro LEDs comprises simultaneously transferring a selected plurality of micro LEDs, from among the plurality of micro LEDs, to sub-pixel regions of a selected group from among the plurality of groups.

3. The method of claim 2, wherein the simultaneously transferring of the selected plurality of micro LEDs comprises transferring a micro LED emitting red light, green light, or blue light to each sub-pixel region from among the sub-pixel regions of the selected group.

4. The method of claim 1, wherein the pixel array panel is provided on a backplane of an LED display.

5. The method of claim 2, wherein the sub-pixel regions of the selected group comprise a plurality of red (R) sub-pixel regions, a plurality of green (G) sub-pixel regions and a plurality of blue (B) sub-pixel regions to form a plurality of pixels,
    wherein each pixel from among the plurality of pixels comprises an R sub-pixel region from among the plurality of R sub-pixel regions, a G sub-pixel region from among the plurality of G sub-pixel regions, and a B sub-pixel region from among the plurality of B sub-pixel regions.

6. The method of claim 5, wherein the simultaneously transferring of the selected plurality of micro LEDs to the sub-pixel regions of the selected group comprises:
    transferring a first micro LED to each R sub-pixel region from among the plurality of R sub-pixel regions using a first inkjet head;
    transferring a second micro LED to each G sub-pixel region from among the plurality of G sub-pixel regions using a second inkjet head; and
    transferring a third micro LED to each B sub-pixel region from among the plurality of B sub-pixel regions using a third inkjet head.

7. The method of claim 1, wherein the plurality of micro LEDs are transferred to each sub-pixel region from among the plurality of sub-pixel regions.

8. The method of claim 7, further comprising:
    removing a micro LED that is not correctly transferred from among the plurality of micro LEDs transferred to each sub-pixel region from among the plurality of sub-pixel regions; and
    transferring a same type of micro LED as a type of the correctly transferred micro LED to a position from which the micro LED is removed.

9. The method of claim 7, wherein banks are provided between adjacent sub-pixel regions from among the plurality of sub-pixel regions.

10. The method of claim 7, wherein each of the sub-pixel regions is divided into a plurality of regions, and
    wherein the method further comprises transferring one micro LED from among the plurality of micro LEDs to each region from among the plurality of regions.

11. The method of claim 10, wherein each region from among the plurality of regions is defined by a mold for guiding the transferred one micro LED.

12. The method of claim 1, wherein
    the at least one micro LED comprises a first semiconductor layer, an active layer and a second semiconductor layer sequentially stacked to form a core-shell structure,
    wherein the active layer comprises a first portion emitting first light in a first direction and a second portion emitting second light in a second direction different from the first direction, and
    wherein the at least one micro LED comprises a horizontal electrode micro LED.

13. The method of claim 1 further comprising transferring a respective micro LED emitting a same color light to all of the plurality of sub-pixel regions.

14. The method of claim 13, wherein the micro LEDs emitting the same color light emit a blue light.

15. The method of claim 13, further comprising:
    forming a first light conversion material layer on each respective micro LED transferred to an R sub-pixel region from among the plurality of sub-pixel regions; and
    forming a second light conversion material layer on each respective micro LED transferred to a G sub-pixel region from among the plurality of sub-pixel regions.

16. A method of transferring at least one micro LED to a pixel array panel comprising a plurality of pixel regions, the method comprising:
    transferring a first micro LED to a first pixel region from among the plurality of pixel regions; and
    transferring a second micro LED to a second pixel region from among the plurality of pixel regions,
    wherein the first micro LED and the second micro LED are transferred by spraying using an inkjet method,
    wherein the transferring of the first micro LED to the first pixel region comprises:
        transferring a plurality of first micro LEDs to the first pixel region, and
    wherein the transferring of the plurality of first micro LEDs to the first pixel region comprises:

transferring a first group of first micro LEDs from among the plurality of first micro LEDs to a first sub-pixel region of the first pixel region using a first inkjet head;

transferring a second group of first micro LEDs from among the plurality of first micro LEDs to a second sub-pixel region of the first pixel region using a second inkjet head; and transferring a third group of first micro LEDs from among the plurality of first micro LEDs to a third sub-pixel region of the first pixel region using a third inkjet head.

17. The method of claim 16, wherein the transferring of the first micro LED to the first pixel region and the transferring of the second micro LED to the second pixel region are performed simultaneously.

18. The method of claim 16, wherein the transferring of the first micro LED to the first pixel region and the transferring of the second micro LED to the second pixel region are performed sequentially.

19. The method of claim 16, wherein a type of the first micro LED is the same as or different from that of the second micro LED.

20. The method of claim 16, wherein a third micro LED is transferred to a remaining pixel region from among the plurality of pixel regions using the inkjet method.

21. The method of claim 16, wherein each of the first micro LED and the second micro LED comprises a respective first semiconductor layer, the respective active layer and a respective second semiconductor layer sequentially stacked to form a respective core-shell structure,
wherein the respective active layer comprises a first portion emitting first light in a first direction and a second portion emitting second light in a second direction different from the first direction, and
wherein each of the first micro LED and the second micro LED comprises a horizontal electrode micro LED.

22. The method of claim 16, wherein the transferring of the first micro LED to the first pixel region comprises:
spraying a solution in which micro LEDs are mixed to the first pixel region using a first inkjet head.

23. The method of claim 16, wherein the transferring of the first group, the transferring of the second group, and the transferring of the third group are simultaneously performed.

24. The method of claim 16, wherein
the transferring of the first group, the transferring of the second group, and the transferring of the third group are sequentially performed,
wherein the method further comprises, after the transferring of the first group, removing a first micro LED of the first group that is not correctly transferred; and
transferring a same type of micro LED as a type of a correctly transferred first micro LED to a position from which the first micro LED is removed, and
the removing and the transferring of the same type of micro LED are performed after the transferring of the second group and the transferring of the third group are performed.

25. The method of claim 16, wherein the first sub-pixel region, the second sub-pixel region, and the third sub-pixel region are each surrounded by a respective bank.

26. The method of claim 16, wherein each of the first sub-pixel region, the second sub-pixel region, and the third sub-pixel region comprises a respective plurality of regions, and
wherein the method further comprises transferring one micro LED from among the plurality of first micro LEDs to each region from among the plurality of regions.

27. The method of claim 26, wherein each region from among the plurality of regions is defined by a mold for guiding the transferred one micro LED.

28. A method of transferring at least one micro LED to a pixel array panel comprising a plurality of pixel regions, the method comprising:
transferring a first micro LED to a first pixel region from among the plurality of pixel regions; and
transferring a second micro LED to a second pixel region from among the plurality of pixel regions,
wherein the first micro LED and the second micro LED are transferred by spraying using an inkjet method,
wherein the transferring of the second micro LED to the second pixel region comprises:
transferring a plurality of second micro LEDs to the second pixel region,
wherein the transferring the plurality of second micro LEDs to the second pixel region comprises:
transferring a first group of second micro LEDs from among the plurality of second micro LEDs to a first sub-pixel region of the second pixel region using a first inkjet head;
transferring a second group of second micro LEDs from among the plurality of second micro LEDs to a second sub-pixel region of the second pixel region using a second inkjet head; and
transferring a third group of second micro LEDs from among the plurality of second micro LEDs to a third sub-pixel region of the second pixel region using a third inkjet head.

29. The method of claim 28, wherein the transferring of the first group, the transferring of the second group, and the transferring of the third group are simultaneously performed.

30. The method of claim 28, wherein
the transferring of the first group, the transferring of the second group, and the transferring of the third group are sequentially performed,
wherein the method further comprises, after the transferring of the first group, removing a second micro LED of the first group that is not correctly transferred, and
wherein the removing is performed after the transferring of the second group and the transferring of the third group are performed.

31. The method of claim 28, wherein each of the first sub-pixel region, the second sub-pixel region, and the third sub-pixel region comprises a respective plurality of regions, and
wherein the method further comprises transferring one micro LED from among the plurality of second micro LEDs to each region from among the plurality of regions.

32. The method of claim 31, wherein each region from among the plurality of regions is defined by a mold for guiding the transferred one micro LED.

* * * * *